(12) United States Patent
Kubota et al.

(10) Patent No.: US 7,774,082 B2
(45) Date of Patent: Aug. 10, 2010

(54) SUBSTRATE PROCESSING METHOD AND STORAGE MEDIUM HAVING PROGRAM STORED THEREIN

(75) Inventors: Shigeru Kubota, Yamanashi (JP); Shinji Sakano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 488 days.

(21) Appl. No.: 11/867,421

(22) Filed: Oct. 4, 2007

(65) Prior Publication Data

US 2008/0091290 A1 Apr. 17, 2008

Related U.S. Application Data

(60) Provisional application No. 60/870,789, filed on Dec. 19, 2006.

(30) Foreign Application Priority Data

Oct. 5, 2006 (JP) .............................. 2006-273793

(51) Int. Cl.
- G06F 19/00 (2006.01)
- G06F 11/30 (2006.01)
- G21C 17/00 (2006.01)
- C03C 15/00 (2006.01)
- C03C 25/68 (2006.01)
- C23F 1/00 (2006.01)

(52) U.S. Cl. ............... 700/110; 700/108; 700/109; 700/121; 702/182; 702/185

(58) Field of Classification Search .................. None
See application file for complete search history.

(56) References Cited

U.S. PATENT DOCUMENTS

| | | | | |
|---|---|---|---|---|
| 5,628,828 A | * | 5/1997 | Kawamura et al. | 118/719 |
| 5,698,989 A | * | 12/1997 | Nulman | 324/719 |
| 5,926,690 A | * | 7/1999 | Toprac et al. | 438/17 |
| 6,413,867 B1 | * | 7/2002 | Sarfaty et al. | 438/689 |
| 6,538,388 B2 | * | 3/2003 | Nakano et al. | 315/111.21 |
| 7,062,411 B2 | * | 6/2006 | Hopkins et al. | 702/185 |
| 7,291,285 B2 | * | 11/2007 | Behm et al. | 216/41 |
| 7,348,266 B2 | * | 3/2008 | Cerio, Jr. | 438/586 |
| 2004/0254762 A1 | * | 12/2004 | Hopkins et al. | 702/182 |

FOREIGN PATENT DOCUMENTS

| | | |
|---|---|---|
| JP | 2001-143982 | 5/2001 |
| JP | 2002-208544 | 7/2002 |

* cited by examiner

Primary Examiner—Albert DeCady
Assistant Examiner—Sunray R Chang
(74) Attorney, Agent, or Firm—Oblon, Spivak, McClelland, Maier & Neustadt, L.L.P.

(57) ABSTRACT

First feedforward calculation is executed when a preprocessing surface profile is measured and a processing chamber with its processing parameter value having been obtained through the first feedforward calculation judged to be within an allowable range is determined. Wafer transfer is executed only in conjunction with a processing chamber having a processing parameter value judged to be within the allowable range, and the wafer is carried to the entry point of the processing chamber. Then, second feedforward calculation is executed by reflecting the results of feedback calculation executed based upon the most recent processing having been executed in the particular processing chamber and wafer processing is executed in the processing chamber based upon the processing parameter value calculated in the second feedforward calculation.

9 Claims, 12 Drawing Sheets

| DECISION-MAKING DATA | | | |
|---|---|---|---|
| | DECISION-MAKING RESULTS | | ALLOWABLE ADJUSTMENT RANGE |
| | FIRST DECISION-MAKING | SECOND DECISION-MAKING | ETCHING TIME LENGTH |
| PROCESSING CHAMBER A | OK | OK | TAg |
| PROCESSING CHAMBER B | NG | — | TBg |

FIG.3

| | SURFACE PROFILES | |
|---|---|---|
| | PREPROCESSING (Dbef) | POSTPROCESSING (Daft) |
| W1 | D1bef | D1aft |
| W2 | D2bef | D2aft |
| W3 | D3bef | D3aft |
| W4 | D4bef | D4aft |
| W5 | D5bef | D5aft |
| W6 | D6bef | D6aft |
| . | . | . |
| . | . | . |
| . | . | . |

| | PROCESSING PARAMETERS | | | | |
|---|---|---|---|---|---|
| | ETCHING TIME LENGTH | PROCESSING CHAMBER INTERNAL PRESSURE | GAS FLOW RATE | HIGH-FREQUENCY POWER | ... |
| PROCESSING CHAMBER A | TA | PA | QA | HA | ... |
| PROCESSING CHAMBER B | TB | PB | QB | HB | ... |

| | CALCULATION DATA | | | | 486 |
|---|---|---|---|---|---|
| | FEEDFORWARD CALCULATION | | FEEDBACK CALCULATION | | |
| | ETCHING TIME LENGTH COMPUTATION EXPRESSION | ETCHING QUANTITY COMPUTATION EXPRESSION | ADJUSTMENT VALUE COMPUTATION EXPRESSION | ADJUSTMENT QUANTITY | |
| PROCESSING CHAMBER A | fTA | fDA | f$\Delta$DA | $\Delta$DA | |
| PROCESSING CHAMBER B | fTB | fDB | f$\Delta$DB | $\Delta$DB | |

| DECISION-MAKING DATA | | | 488 |
|---|---|---|---|
| | DECISION-MAKING RESULTS | | ALLOWABLE ADJUSTMENT RANGE |
| | FIRST DECISION-MAKING | SECOND DECISION-MAKING | ETCHING TIME LENGTH |
| PROCESSING CHAMBER A | OK | OK | TAg |
| PROCESSING CHAMBER B | NG | — | TBg |

SUBSTRATE PROCESSING METHOD AND STORAGE MEDIUM HAVING PROGRAM STORED THEREIN

CROSS-REFERENCE TO RELATED APPLICATIONS

This document claims priority to Japanese Patent Application Number 2006-273793, filed on Oct. 5, 2006 and U.S. Provisional Application No. 60/870,789, filed on Dec. 19, 2006, the entire content of which are hereby incorporated by reference.

FIELD OF THE INVENTION

The present invention relates to a substrate processing method to be adopted when executing a specific type of processing such as etching on a surface of a processing target substrate such as a semiconductor wafer and a storage medium having a program stored therein.

BACKGROUND OF THE INVENTION

Ever finer design details need to be satisfied in today's semiconductor integrated circuit design rules by assuring a higher level of dimensional accuracy in circuit patterns formed at the surfaces of semiconductor wafers (hereafter may be simply referred to as "wafers"). When a plurality of wafers is processed continuously, conditions inside the processing chamber gradually change, resulting in subtle variations in the dimensions of the circuit pattern formed on the wafer surface. For this reason, it is particularly critical to achieve the intended processing results with a higher level of accuracy by fine-adjusting the values of processing parameters.

Inconsistencies in the processing results may be corrected by, for instance, calculating through feedforward calculation the value of a processing parameter needed to achieve the precise design shape based upon the dimensions of a target element formed on a wafer, which are measured prior to the processing and executing feedback calculation based upon feedback providing the results of postprocessing target element dimension measurement (see, for instance, patent reference literatures 1 and 2). With a feedforward calculation then executed by reflecting the feedback calculation results, the subsequent wafer processing can be executed based upon the processing parameter value adjusted through the feedback calculation.

(patent reference literature 1) Japanese Laid Open Patent Publication No. 2001-143982

(patent reference literature 2) Japanese Laid Open Patent Publication No. 2002-208544

When processing wafers continuously by transferring the individual wafers between a processing chamber where the wafer processing is executed and a measurement chamber where the dimensions and the like of a target element formed on the wafer surface are measured, it is desirable to execute the measurement processing for a next wafer and transfer the next wafer having undergone the measurement processing toward the processing chamber before the current wafer processing in the processing chamber is completed so as to assure better throughput.

However, the results obtained by executing the feedback calculation are reflected in the feedforward calculation in the related art. This means that if the next wafer is transferred toward the processing chamber where the current wafer processing is still underway, feedforward calculation may be executed without reflecting the results of the most recent feedback calculation depending upon the timing with which the wafer is transferred and the timing with which the feedforward calculation is executed.

For instance, if the feedforward calculation is executed with the timing with which the dimensions of the target element on a second wafer having been carried into the measurement chamber are measured while the processing on a first wafer is underway in the processing chamber, the feedforward calculation will be executed without reflecting the results of the feedback calculation executed for the most recently processed wafer, i.e., the first wafer. Under such circumstances, the accuracy of the feedforward calculation is bound to be lowered.

While it may appear that the feedforward calculation should be executed by transferring the subsequent wafer, i.e., the second wafer, to the measurement chamber after completing the feedback calculation executed based upon the processing results for the first wafer most recently processed in the processing chamber, this is bound to result in a greatly reduced throughput since the next wafer is carried into the measurement chamber for the preprocessing measurement only after the post-processing measurement for the preceding wafer is completed.

As an alternative, the timing with which the feedforward calculation is executed may be retarded as much is possible by, for instance, executing the feedforward calculation with the timing with which a wafer is transferred to a stage immediately preceding the processing chamber (e.g., to a loadlock chamber). However, this alternative is problematic in that if the value of the processing parameter (e.g., the etching time) is determined to be beyond the allowable range at the time of the feedforward calculation, the etching process cannot be executed in the processing chamber and thus, the wafer transfer processing will have been executed in vain.

SUMMARY OF THE INVENTION

An object of the present invention having been completed by addressing the issues of the related art discussed above is to provide a substrate processing method and a storage medium having a program stored therein with which processing target substrates can be transferred and processed continuously while maintaining a desired level of throughput by eliminating superfluous transfer of processing target substrates and an improvement in the accuracy of processing parameter adjustment achieved through feedforward calculation, is assured.

The object described above is achieved in an aspect of the present invention by providing a substrate processing method, to be adopted in a substrate processing apparatus that includes a processing chamber where processing is executed on a processing target substrate based upon a specific processing parameter and a measurement chamber where a preprocessing surface profile and a postprocessing surface profile of the processing target substrate are measured comprising a preprocessing measurement phase in which the preprocessing surface profile of the processing target substrate is measured in the measurement chamber, a first calculation phase executed before starting transfer of the processing target substrate toward the processing chamber, in which a processing parameter value for achieving a target surface profile is calculated by using a preprocessing surface profile measurement value obtained by measuring the preprocessing surface profile, a decision-making phase in which a decision is made as to whether or not the processing parameter value having been calculated is within a preset allowable range, a second calculation phase executed during the time elapsing after starting to transfer the processing target substrate toward the processing chamber and ending before the processing target substrate is actually carried into the processing chamber when the processing parameter value is judged to be within the allowable range in the decision-making phase, in which the processing parameter value for achieving the target surface profile is recalculated by using an adjustment value obtained based upon a postprocessing surface profile measurement value resulting from measurement of the of a processing target substrate having been most recently processed in the processing chamber and the measurement value resulting and the preprocessing surface profile measurement value, and a processing phase in which the processing target substrate is carried into the processing chamber and the processing is executed on the processing target substrate based upon the processing parameter value calculated in the second calculation phase.

The object described above is also achieved in another aspect of the present invention by providing a computer-readable storage medium having stored therein a program to be used when executing substrate processing in a substrate processing apparatus that includes a processing chamber where processing is executed on a processing target substrate based upon a specific processing parameter and a measurement chamber where a preprocessing surface profile and a postprocessing surface profile of the processing target substrate are measured. The program stored in the storage medium enables a computer to execute a preprocessing measurement step in which the preprocessing surface profile of the processing target substrate is measured in the measurement chamber, a first calculation step executed before starting to transfer the processing target substrate toward the processing chamber, in which a processing parameter value for achieving a target surface profile is calculated by using a preprocessing surface profile measurement value obtained by measuring the preprocessing surface profile, a decision-making step in which a decision is made as to whether or not the processing parameter value having been calculated is within a preset allowable range, a second calculation step executed during the time elapsing after starting to transfer the processing target substrate toward the processing chamber and ending before the processing target substrate is actually carried into the processing chamber when the processing parameter value is judged to be within the allowable range in the decision-making step in which the processing parameter value for achieving the target surface profile is recalculated by using an adjustment value obtained based upon a postprocessing surface profile measurement value resulting from measurement of the postprocessing surface profile of a processing target substrate having been most recently processed in the processing chamber and the preprocessing surface profile measurement value and a processing step in which the processing target substrate is carried into the processing chamber and the processing is executed on the processing target substrate based upon the processing parameter value calculated in the second calculation step.

According to the present invention described above, in which a decision is made as to whether or not the processing parameter value calculated in the first processing parameter calculation (first calculation) is within the allowable range, the processing target substrate is transferred to the processing chamber only if it is decided that the processing target substrate should be transferred to the processing chamber. As a result, the problematic situation which tends to occur in the related art, whereby a processing target substrate having been already transferred to the processing chamber cannot be processed with the processing parameter value judged to be beyond the allowable range, can be prevented. In other words, a superfluous execution of processing target substrate transfer processing is prevented. In addition, in the second processing parameter calculation (second calculation), a processing parameter value can be determined by reflecting the adjustment value determined based upon the most recent processing executed in the processing chamber, achieving an improvement in the processing parameter adjustment accuracy. Furthermore, the processing parameter value calculated in the first feedforward calculation (first calculation) is not intended to be used in the actual execution of processing target substrate processing and thus, the preprocessing surface profile measurement can be executed while the immediately preceding processing target substrate is being processed, allowing the substrate transfer processing to be executed without lowering the throughput.

Moreover, upon completing the processing in the processing chamber, a postprocessing measurement phase, in which the processing target substrate having been processed is carried into the measurement chamber and the postprocessing surface profile is measured and an adjustment value calculation phase, in which the adjustment value to be used to adjust the processing parameter value is calculated based upon the postprocessing surface profile measurement value are executed. Thus, a processing parameter value reflecting the latest adjustment value can be determined when processing the next processing target substrate, which assures an improvement in the processing parameter adjustment accuracy.

It is to be noted that fine dimensions of a target element formed on the processing target substrate may be measured as the surface profile and that the processing parameter may be, for instance, the length of time over which the processing target substrate is processed.

The object described above is further achieved in yet another aspect of the present invention by providing a substrate processing method to be adopted in a substrate processing apparatus that includes a plurality of processing chambers where processing target substrates are processed based upon a specific processing parameter and a measurement chamber where a preprocessing surface profile and a postprocessing surface profile of a processing target substrate are measured, comprising a preprocessing measurement phase in which the preprocessing surface profile of the substrate target substrate is measured in the measurement chamber, a first calculation phase executed before starting to transfer the processing target substrate toward one of the processing chambers, in which values of the processing parameter for achieving a target surface profile are calculated in correspondence to the individual processing chambers by using a preprocessing surface profile measurement value obtained by measuring the preprocessing surface profile, a decision-making phase in which a decision is made as to whether or not the processing parameter values having been calculated in correspondence to the individual processing chambers are each within a predetermined allowable range, a second calculation phase executed during the time elapsing after starting the transfer of the processing target substrate toward one of processing chambers with processing parameter values thereof each having been judged in the decision-making phase to be within the allowable range and ending before the processing target substrate is actually carried into the processing chamber, in which a processing parameter value for achieving the target surface profile is recalculated by using an adjustment value determined by using a postprocessing surface profile measurement value obtained by measuring the postprocessing surface profile of a processing target substrate having been most recently processed in the particular processing chamber and the preprocessing surface profile measurement value, and a processing phase in which the processing target substrate is carried into the processing chamber and the processing target substrate is processed based upon the processing parameter value calculated in the second calculation phase.

The object described above is also achieved in another aspect of the present invention by providing a computer-readable storage medium having stored therein a program to be used when executing substrate processing in a substrate processing apparatus that includes a plurality of processing chambers where processing target substrates are processed based upon a specific processing parameter and a measurement chamber where a preprocessing surface profile and a postprocessing surface profile of a processing target substrate are measured. The program enables a computer to execute a preprocessing measurement step in which the preprocessing surface profile of the substrate target substrate is measured in the measurement chamber, a first calculation step executed before starting to transfer the processing target substrate toward one of the processing chambers, in which values of the processing parameter for achieving a target surface profile are calculated corresponding to the individual processing chambers by using a preprocessing surface profile measurement value obtained by measuring the preprocessing surface profile, a decision-making step in which a decision is made as to whether or not the processing parameter values having been calculated in correspondence to the individual processing chambers are within a predetermined allowable range, a second calculation step executed during the time elapsing after starting the transfer of the processing target substrate toward one of processing chambers with processing parameter values thereof having been judged in the decision-making step to be within the allowable range, in which a processing parameter value for achieving the target surface profile is recalculated by using an adjustment value determined by using a postprocessing surface profile measurement value obtained by measuring the postprocessing surface profile of a processing target substrate having been most recently processed in the particular processing chamber and the preprocessing surface profile measurement value, and a processing step in which the processing target substrate is carried into the processing chamber and the processing target substrate is processed based upon the processing parameter value calculated in the second calculation step.

According to the present invention in which values of the processing parameter are calculated for the individual processing chambers through the first processing parameter calculation (first calculation) and a decision is made as to whether or not each processing parameter value calculated in correspondence to one of the processing chambers, is within the allowable range, the processing target substrate is transferred only to a processing chamber with a processing parameter value judged to be within the allowable range by making a decision prior to the actual processing target substrate transfer to the processing chamber as to whether or not the transfer processing should be executed. As a result, superfluous execution of processing target substrate transfer processing is prevented. In addition, in the second processing parameter calculation (second calculation), a processing parameter value reflecting the adjustment value determined based upon the most recent processing having been executed in the specific processing chamber where the processing target substrate is to be processed shortly can be calculated, assuring an improvement in the processing parameter adjustment accuracy.

The object described above is further achieved in yet another aspect of the present invention by providing a substrate processing method to be adopted in a substrate processing apparatus that includes a plurality of processing chambers where processing target substrates are processed based upon a specific processing parameter and a measurement chamber where a preprocessing surface profile and a postprocessing surface profile of a processing target substrate are measured, comprising a preprocessing measurement phase in which the preprocessing surface profile of the substrate target substrate is measured in the measurement chamber, a first calculation phase executed before starting to transfer the processing target substrate toward one of the processing chambers, in which values of the processing parameter for achieving a target surface profile are calculated by using a preprocessing surface profile measurement value obtained by measuring the preprocessing surface profile in correspondence to the individual processing chambers, a first decision-making phase in which a decision is made as to whether or not the processing parameter values having been calculated in correspondence to the individual processing chambers are each within a predetermined allowable range, a second calculation phase executed during the time elapsing after starting the transfer of the processing target substrate toward one of the processing chambers having processing parameter values thereof each having been judged in the first decision-making phase to be within the allowable range and ending before the processing target substrate is actually carried into the processing chamber, in which a processing parameter value for achieving the target surface profile is recalculated by using an adjustment value determined by using a postprocessing surface profile measurement value obtained by measuring the postprocessing surface profile of a processing target substrate having been most recently processed in the particular processing chamber and the preprocessing surface profile measurement value, a second decision-making phase in which a decision is made as to whether or not the processing parameter value calculated in the second calculation phase is within a predetermined allowable range and a processing phase in which the processing target substrate is carried into the processing chamber and the processing target substrate is processed based upon the processing parameter value calculated in the second calculation phase if the processing parameter value is judged in the second decision-making phase to be within the allowable range but the processing target substrate is transferred toward another processing chamber with a processing parameter value having been judged in the first decision-making phase to be within the allowable range, a processing parameter value is recalculated by executing the second calculation phase and the is processed accordingly if it is decided in the second decision-making phase to be outside the allowable range.

According to the present invention described above, after a processing parameter value is recalculated in the second calculation phase, a decision is made in the second decision-making phase as to whether or not the recalculated processing parameter value is within the allowable range and if the value is judged to be outside the allowable range, the processing target substrate is transferred to another processing chamber, the processing parameter value of which has been judged in the first decision-making phase to be within the allowable range. As a result, superfluous execution of the transfer processing is prevented.

The object described above is further achieved in yet another aspect of the present invention by providing a substrate processing method to be adopted in a substrate processing apparatus that includes a plurality of processing chambers where processing target substrates are processed based upon a specific processing parameter and a measurement chamber where a preprocessing target element dimension and a postprocessing target element dimension of a target element on a processing target substrate are measured, comprising a preprocessing measurement phase in which the preprocessing target element dimension at the processing target substrate is measured in the measurement chamber, a first calculation phase executed before starting to transfer the processing target substrate toward one of the processing chambers, in which etching time lengths for achieving a target dimension are calculated in correspondence to the individual processing chambers based upon a preprocessing target element dimension measurement value obtained by measuring the preprocessing target element dimension, a decision-making phase in which a decision is made as to whether or not the etching time lengths having been calculated in correspondence to the individual processing chambers are each within a predetermined allowable range, a second calculation phase executed during the time elapsing after starting the transfer of the processing target substrate toward one of processing chambers with processing parameter values thereof each having been judged in the decision-making phase to be within the allowable range, and ending before the processing target substrate is actually carried into the processing chamber, in which an etching time length for achieving the target dimension is recalculated by using an adjustment value determined by using a postprocessing target element dimension measurement value obtained by measuring the postprocessing target element dimension of a processing target substrate having been most recently etched in the particular processing chamber and the preprocessing target element dimension measurement value, and a processing phase in which the processing target substrate is carried into the processing chamber and is etched over the etching time length having been calculated in the second calculation phase. As described above, the present invention may be adopted when etching a processing target substrate over the length of time calculated as a processing parameter.

The present invention provides a substrate processing apparatus and a storage medium with a program stored therein, with which processing target substrates can be transferred and processed continuously while maintaining a desired level of throughput by eliminating superfluous transfer of processing target substrates and an improvement in the adjustment accuracy is assured for the processing parameter calculated through feedforward calculation.

BRIEF DESCRIPTION OF THE DRAWINGS

FIG. 3 presents an example of a data table containing the surface profile data in FIG. 2;

FIG. 4 presents an example of a data table containing the processing parameter data in FIG. 2;

FIG. 5 presents an example of a data table containing the calculation data in FIG. 2;

DETAILED DESCRIPTION OF THE PREFERRED EMBODIMENTS

Figure 1:
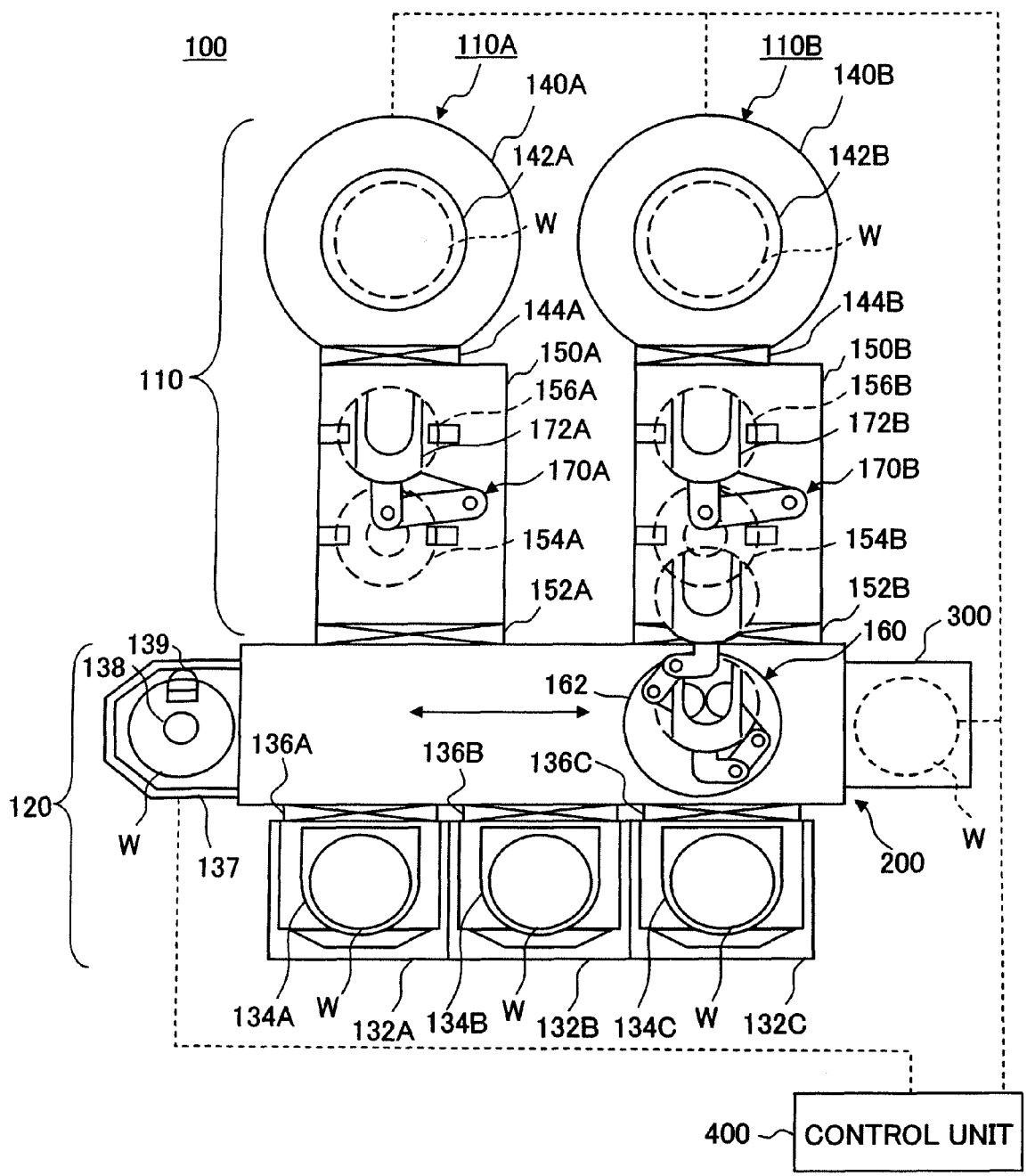
FIG. 1 is a sectional view of an example of a structure that may be adopted in a substrate processing apparatus in an embodiment of the present invention.

The following is a detailed explanation of a preferred embodiment of the present invention, given in reference to the attached drawings. It is to be noted that in the description and the drawings, the same reference numerals are assigned to components having substantially identical functions and structural features to preclude the necessity for a repeated explanation thereof.

(Structural Example for Substrate Processing Apparatus)

First, a structural example that may be adopted in the substrate processing apparatus in the embodiment of the present invention is explained in reference to a drawing. The substrate processing apparatus in this example includes at least one vacuum processing unit connected to a transfer chamber. FIG. 1 is a sectional view schematically illustrating the structure of the substrate processing apparatus achieved in the embodiment.

The substrate processing apparatus 100 includes either a single vacuum processing unit 110 or a plurality of vacuum processing units 110 where any of various types of processing, such as film formation and etching, is executed on a processing target substrate, e.g., a semiconductor wafer (hereafter may be simply referred to as a "wafer") W, and a transfer unit 120 that transfers the wafer W into/out of each vacuum processing unit 110. The transfer unit 120 includes a common transfer chamber 200 used to transfer wafers W.

In the example presented in FIG. 1, two vacuum processing units 110A and 110B are disposed along a side surface of the transfer unit 120. The vacuum processing units 110A and 110B respectively include processing chambers 140A and 140B and evacuatable load-lock chambers 150A and 150B disposed continuous to the respectively processing chambers. In the processing chambers 140A and 140B of the vacuum processing units 110A and 110B, a single type of processing such as etching, can be executed on wafers W.

The processing chambers 140A and 140B both assume a structure that allows them to function as plasma processing devices with high-frequency power applied to electrodes disposed therein to function as wafer stages 142A and 142B and a processing gas delivered into the processing chambers 140A and 140B raised to plasma to enable a plasma etching process to be executed on wafer surfaces. It is to be noted that the processing chambers may adopt a structure other that than described above. In addition, while an explanation is provided above on an example in which the substrate processing apparatus includes two vacuum processing units each equipped with a processing chamber, as shown in FIG. 1, the present invention is not limited to this example and may be adopted in a substrate processing apparatus with three or more vacuum processing units each equipped with a processing chamber.

The transfer chamber 200 at the transfer unit 120 is formed as a box with a substantially rectangular section, where an inert gas such as $N_2$ gas or clean air is circulated. A plurality of cassette tables 132A through 132C are disposed side-by-side at one of the side surfaces of the transfer chamber 200 ranging along the longer side of the substantially rectangular section. The cassette tables 132A through 132C function as substrate standby ports, at which cassette containers 134A through 134C are placed. While FIG. 1 shows three cassette containers 134A through 134C each placed on one of the cassette tables 132A through 132C, the numbers of the cassette tables and cassette containers are not limited to this example and there may be one or two cassette tables and cassette containers, or there may be four or more cassette tables and cassette containers.

At each of the cassette containers 134A through 134C, up to 25 wafers W, for instance, can be stored in multiple racks with equal pitches. The cassette containers assume a sealed structure with, for instance, an $N_2$ gas atmosphere filling the space therein. Wafers W can be carried into/out of the transfer chamber 130 via gate valves 136A through 136C.

A common transfer mechanism (atmospheric pressure-side transfer mechanism) 160 that transfers a wafer W along the length (along the direction indicated by the arrow in FIG. 1) thereof is disposed inside the transfer chamber 200. The common transfer mechanism 160 is fixed onto, for instance, a base 162 and the base 162 is allowed to slide on a guide rail (not shown) disposed over the central area of the transfer chamber 200 so as to extend along the length thereof via, for instance, a linear motor drive mechanism. The common transfer mechanism 160 may be a double-arm mechanism equipped with two end effectors, as shown in FIG. 1, or it may be a single-arm mechanism equipped with a single end effector.

At the other side surface of the transfer chamber ranging along the longer side of the substantially rectangular section, the base ends of the two load-lock chambers 150A and 150B are connected via switchable gate valves (atmospheric pressure-side gate valves) 152A and 152B. The front ends of the load-lock chambers 150A and 150B are respectively connected to the processing chambers 140A and 140B via switchable gate valves (vacuum pressure-side gate valves) 144A and 144B.

In the load-lock chambers 150A and 150B, a pair of buffer stages 154A and 156A and a pair of buffer stages 154B and 156B on which wafers W are temporarily held in standby are respectively disposed. In the explanation, the buffer stages 154A and 154B disposed closer to the transfer chamber are referred to as first buffer stages, whereas the buffer stages 156A and 156B disposed on the other side are referred to as second buffer stages. Individual transfer mechanisms (vacuum pressure-side transfer mechanisms) 170A and 170B, each constituted with an articulated arm capable of flexing, rotating and moving up/down, are disposed respectively between the buffer stages 154A and 156A and between the buffer stages 154B and 156B.

At the front ends of the individual transfer mechanisms 170A and 170B, end effectors 172A and 172B are respectively disposed, so that wafers W can be transferred between the first and second buffer stages 154A and 156A and between the first and second buffer stages 154B and 156B via the end effectors 172A and 172B respectively. It is to be noted that wafers are carried from the load-lock chambers 150A and 150B to the processing chambers 140A and 140B and vice versa via the respective individual transfer mechanisms 170A and 170B.

At an end of the transfer chamber 200, i.e., at one side surface ranging along the shorter side of the substantially rectangular section, a positioning device, e.g., an orienter (a pre-alignment stage) 137 to function as a wafer positioning device is disposed. The orienter 137 includes, for instance, a rotary stage 138 and an optical sensor 139 which optically detects the peripheral edge of a wafer W, both installed as built-in units, and aligns the wafer W by detecting an orientation flat, a notch or the like formed therein.

At the other end of the transfer chamber 200, i.e., at the other side surface of the transfer chamber 200 along the shorter side of the substantially rectangular section, a measurement chamber 300, where a wafer surface profile is measured, is installed. For instance, when etching the trims off the target material E on the wafer surface by using a specific mask pattern M as shown in FIG. 3, the fine dimensions (CD (critical dimension) value) indicating the width of a target element constituted with the etching target material E are measured as a wafer surface profile. Instead of the fine dimensions of the target element such as the CD value, the thickness of a film constituted of the etching target material, the etching form, the etching rate or consistency of the characteristics such as those listed above may be measured as the wafer surface profile.

In the measurement chamber 300, the wafer surface profile is measured through, for instance, scatterometry or ellipsometry, e.g., optical digital profilometry. For instance, the measurement chamber 300 may include a stage on which a wafer is placed disposed therein, a light source from which light is radiated onto the wafer on the stage, a light receiving unit that receives light reflected from the wafer and a measurement unit that measures the surface profile based upon the reflected light.

The various units constituting the substrate processing apparatus, including the processing chambers 140A and 140B, the measurement chamber 300, the orienter 137 and the individual transfer mechanisms 160 and 170 are controlled based upon control signals provided by a control unit 400. The control unit 400 executes wafer processing by controlling the various units based upon a specific program.

(Structural Example for Control Unit)

Figure 2:
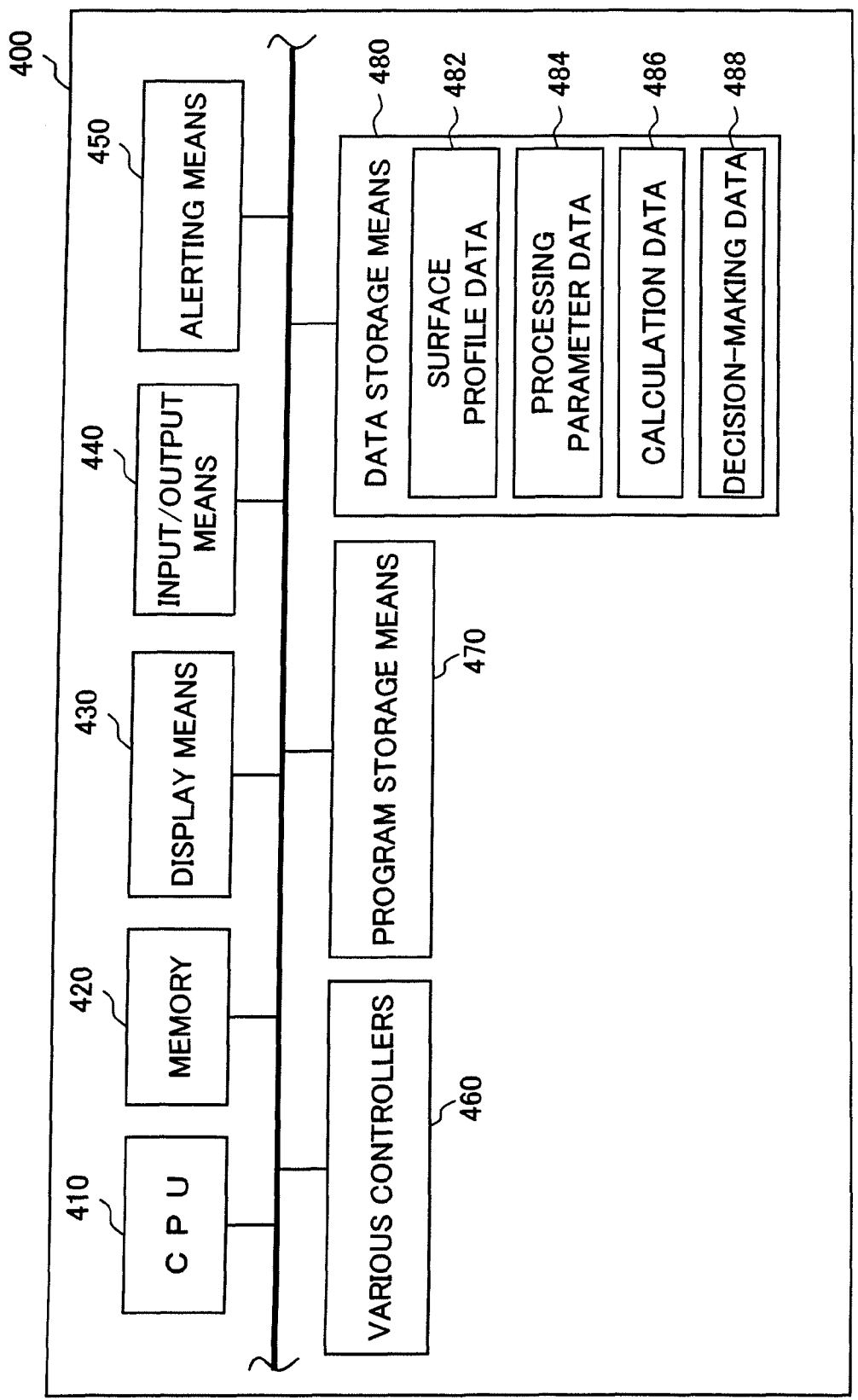
FIG. 2 is a block diagram of a structural example that may be adopted in the control unit in FIG. 1.

Next, a structural example that may be adopted in the control unit 400 is explained in reference to drawings. FIG. 2 is a block diagram showing a structural example of the control unit 400. The control unit 400 comprises a CPU (central processing unit) 410 constituting the control unit main body, a memory 420 such as a ROM (read only memory) or a RAM (random access memory) used by the CPU 410 when it controls the various units, executes data processing and the like, a display means 430 constituted with a liquid crystal display or the like at which an operation screen or a selection screen is brought up on display, an input/output means 440 constituted with an operation panel or the like that allows an operator to input/output various types of data, an alerting means 450 constituted with, for instance, a warning device such as an alarm and various controllers 460 engaged in operation by the CPU to control the various units constituting the substrate processing apparatus 100.

The control unit 400 further includes a program storage means 470 for storing various programs to be executed by the CPU 410, a data storage means 480 for storing data used by the CPU 410 when it executes control processing, data processing and the like. It is to be noted that the program storage means 470 and the data storage means 480 may be constituted with, for instance, a memory or a hard disk. The CPU 410 executes the control processing or the data processing by reading out as necessary to the appropriate program and data from the program storage means 470 and the data storage means 480.

The CPU 410, the memory 420, the display means 430, the input/output means 440, the alerting means 450, the various controllers 460, the program storage means 470 and the data storage means 480 are electrically connected via a bus line such as a control bus, a system bus or a data bus.

The various controllers 460 include controllers engaged in control of various components in the individual processing chambers 140A and 140B as well as the controllers used to control the measurement chamber 300, the common transfer mechanism 160, the individual transfer mechanisms 170A and 170B and the orienter 137. It is to be noted that the various units in each of the processing chambers 140A and 140B may instead be controlled by a dedicated control unit provided in conjunction with each of the processing chambers 140A and 140B. In such a case, the control unit 400 should be connected with the individual control units serving the respective processing chambers 140A and 140B so as to control the substrate processing apparatus 100 by exchanging data and signals.

In the program storage means 470, a wafer transfer program based upon which wafers are transferred by controlling, for instance, the common transfer mechanism 160, the individual transfer mechanisms 170A and 170B and the like, a measurement program based upon which the wafer surface profile is measured by controlling the various components in the measurement chamber 300 and a wafer processing program based upon which a specific type of processing such as etching is executed on wafers in the processing chambers 140A and 140B by controlling various components of the processing chambers 140A and 140B based upon processing parameters (processing conditions) stored in, for instance, a data table 484, are stored. In addition, programs based upon which calculations and processing that need to be executed in the substrate processing apparatus, such as feed forward calculation, feedback calculation and processing parameter decision-making processing are executed, are stored in the program storage means. It is to be noted that the control unit 400 executes the wafer processing to be described later (e.g., the processing shown in FIGS. 9A through 9C) and the like by controlling the various units constituting the substrate processing apparatus 100 based upon these programs read out as necessary.

In the data storage means 480, data to be used in the feedforward calculation, the feedback calculation, the wafer processing and the like to be detailed later, are stored. More specifically, a surface profile data table 482, the processing parameter data table 484, a calculation data table 486, a decision-making data table 488 and the like are stored in the data storage means 480 as shown in FIG. 2.

In the surface profile data table 482, a preprocessing surface profile and a postprocessing surface profile of each wafer having been measured in the measurement chamber 300 are stored as shown in FIG. 3. In the processing parameter data table 484, parameter values based upon which the wafer processing is executed are stored in correspondence to each of the processing chambers 140A and 140B as shown in FIG. 4. It is to be noted that the preprocessing surface profile is used in automatic calculation of the processing parameter values executed through the feedforward calculation, whereas the postprocessing surface profile is used in automatic calculation of an adjustment value to be used to adjust a processing parameter value executed in the feedback calculation.

The processing parameters may include, for instance, the etching time length, the processing chamber internal pressure, the flow rate of the processing gas to be delivered into the processing chamber and the high-frequency power applied to the electrode, as shown in FIG. 4. In the automatic processing parameter value calculation executed through the feedforward calculation, the values corresponding to all the processing parameters may be calculated for processing parameter update. Alternatively, the value corresponding to a single processing parameter may be calculated for processing parameter update or the values of two or more processing parameters may be calculated in combination for processing parameter update, without updating the values of the remaining parameters. For instance, the etching time length alone may be automatically calculated for an update.

In the calculation data table 486, computation expressions based upon which various calculations are executed, e.g., a computation expression based upon which the etching quantity to be used in the feedforward calculation is calculated, a computation expression based upon which a processing parameter value is calculated and a computation expression based upon which the adjustment value to be used in the feedback calculation is calculated, are stored as shown in FIG. 5. In addition, the adjustment value calculated in the feedback calculation and the like are also stored in the calculation data table.

Figures 6, 7:
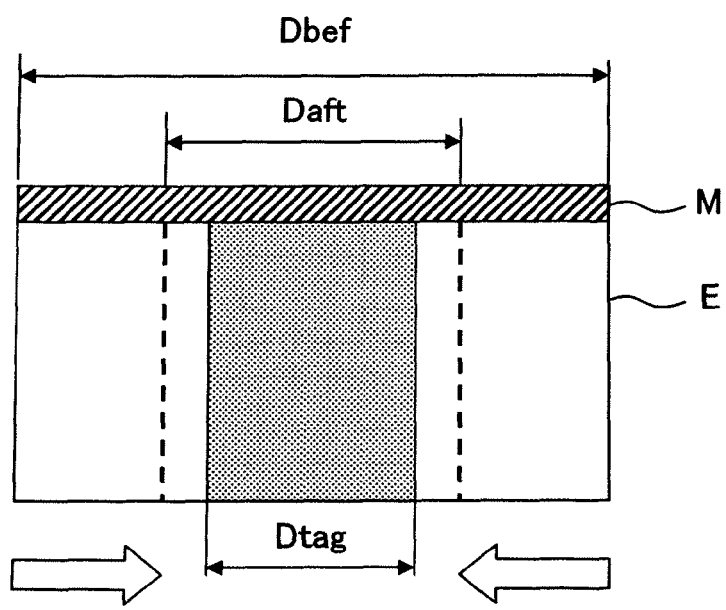
FIG. 6 presents an example of a data table containing the decision-making data in FIG. 2.
FIG. 7 schematically illustrates an example of a target element that may be formed on the wafer surface in the embodiment.

As shown in FIG. 6, data needed when making a decision as to whether or not the processing parameter value having been calculated in the feedforward calculation is within a predetermined allowable adjustment range, the decision-making results and the like are stored in the decision-making data table 488. More specifically, data indicating the allowable adjustment ranges set in correspondence to the individual processing chambers 140A and 140B with regard to the values of the processing parameter (e.g., the etching time length), the decision-making results obtained in correspondence to the individual processing chambers 140A and 140B and the like are stored in the decision-making data table. The decision-making results include first decision-making results indicating the results of first decision-making executed immediately after wafer surface profile measurement as detailed later and second decision-making results indicating the results of second decision-making executed immediately before the wafer processing. As these decision-making results, "OK" is stored if the processing parameter value obtained through the feedforward calculation is within the predetermined allowable adjustment range and "NG" is stored if the processing parameter value is outside the allowable adjustment range.

It is to be noted that desired settings can be freely selected for the data in the data tables 482, 484, 486 and 488 and the data in the data tables can be freely edited by the operator as he performs specific operations at the input/output means 440 constituted with an operation panel or the like.

(Wafer Processing Executed in the Processing Chambers)

Next, the wafer processing executed in the individual processing chambers 140A and 140B is explained. It is to be noted that identical processing is executed in the processing chambers 140A and 140B in the embodiment as explained earlier. The following explanation is provided by assuming that the wafer processing is executed to etch trims off an etching target material E on the wafer surface by using a specific mask pattern M, as shown in FIG. 7.

If this etching process is continuously executed by using a processing parameter value that stays unchanged, a uniform etching quantity should be achieved for all the wafers. However, the etching quantity achieved through the actual etching process tends to change over time since the conditions inside the processing chambers gradually change as the etching process is repeatedly executed. In addition, after maintenance work, e.g., component replacement or cleaning processing executed to clean the inside of the processing chambers, the conditions inside the processing chambers improve, to result in a shift in the etching quantity.

Figure 8:
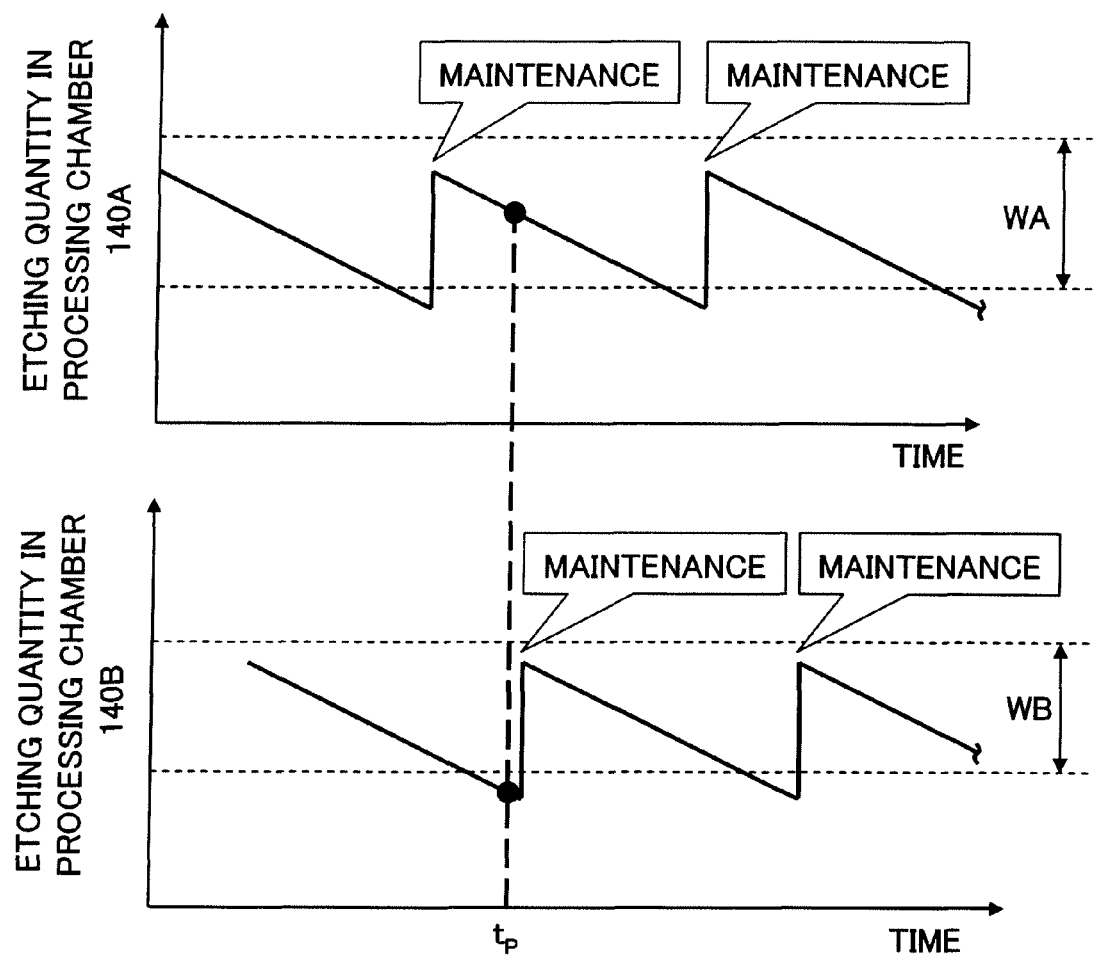
FIG. 8 shows the relationships each observed in one of the processing chambers in the embodiment with regard to the etching quantity indicating the extent of etching and the time (the number of processed wafers)

For instance, when the wafer processing is executed continuously, the etching quantity tends to decrease gradually, as shown in FIG. 8. Then, each time scheduled maintenance work is performed, the etching quantity tends to shift back to the initial etching quantity level.

In a substrate processing apparatus equipped with a plurality of processing chambers with varying characteristics (e.g., different etching rates) where the wafer processing start and the wafer processing end occur with varying timing, the etching quantity tends to change differently in the individual processing chambers. FIG. 8 illustrates the tendencies with which the etching quantity changes in the processing chambers 140A and 140B. The allowable ranges WA and WB within which the etching process can be executed in the respective processing chambers 140A and 140B are each indicated by the dotted lines in FIG. 8. At a time point tp, the etching quantity is within the allowable range WA set for the processing chamber 140A indicating that the etching process can be executed in the processing chamber 140A, whereas the etching quantity is outside the allowable range WB set for the processing chamber 140B indicating that the etching process cannot be executed in the processing chamber 140B.

Accordingly, feedforward calculation and feedback calculation through which adverse effects attributable to the gradual change occurring in the etching quantity over time and the shift occurring in the etching quantity after maintenance work as explained above are automatically corrected are executed in the embodiment so as to assure at all times the desired processing results from continuous wafer processing.

(Feedforward Calculation)

The feedforward calculation executed prior to the etching process is first explained. In the feedforward calculation, the fine dimension value (CD value) Dbef indicating the width of the target element constituted of the etching target material E is measured before the etching process and a processing parameter value for achieving, as processing results, a target dimension value (target CD value) Dtag for the width of the target element is automatically calculated. The processing parameter, which is a parameter constituting part of processing conditions under which the various components in the processing chambers are controlled, may be, for instance, the etching time length, the processing gas flow rate, the level of high-frequency power applied to the electrode or the processing chamber internal pressure.

A specific example of such feedforward calculation is now explained. First, based upon the CD value Dbef having been obtained through the preprocessing measurement and the target CD value Dtag, the etching quantity is determined. More specifically, the etching quantity may be calculated as expressed in (1) below.

$$D = D_{bef} - D_{tag} + \Delta D \quad (1)$$

$\Delta D$ in the expression above represents an etching quantity adjustment value obtained through the feedback calculation to be detailed later. The adjustment value $\Delta D$ is added so as to reflect the feedback calculation results in the feedforward calculation. Thus, even when the etching quantity gradually changes over time, the processing parameter value (e.g., the etching time length) is adjusted with the adjustment value $\Delta D$, and the desired etching quantity is assured at all times. In other words, the target CD value can be achieved at all times.

Based upon the etching quantity D, the etching time length t is determined. In more specific terms, the etching time length t corresponding to the etching quantity D is determined based upon the correlation between the etching quantity and the etching time length. It is to be noted that the correlation between the etching quantity and the etching time length may be indicated by a computation expression (function) obtained in advance through testing or the like, or it may be indicated by correlation data of a plurality of etching quantities and corresponding etching time lengths. The two side surfaces of the element constituted of the etching target material E are simultaneously etched as shown in FIG. 7 through the trim etching process, and accordingly, the etching quantity and the etching time length should be calculated for the trim etching process by taking into consideration that the etching quantity (trimming quantity) is twice the etching rate.

In addition, a decision may be made with regard to the etching time length having been calculated in the feedforward calculation as to whether or not the etching time length is within a predetermined allowable adjustment range, so as to judge whether or not the processing can be executed in the processing chamber (whether or not to transfer a substrate to the processing chamber. Namely, the etching time length is calculated in the feedforward calculation by incorporating the adjustment value $\Delta D$ obtained through the feedback calculation and if this adjustment value $\Delta D$ is very large, the etching time length will be outside the predetermined allowable adjustment range, i.e., the etching process cannot be executed. In addition, when the etching time length fluctuates greatly due to a large value calculated as the adjustment value $\Delta D$, an error may have occurred.

Accordingly, if the etching time length is within the allowable adjustment range, decision-making results OK are indicated and the etching process is executed accordingly, whereas if the etching time length is outside the allowable adjustment range, decision-making results NG are indicated and, accordingly, the etching process is not executed.

(Feedback Calculation)

Next, the feedback calculation executed after the etching process is explained. In the feedback calculation, a CD value Daft of the target element constituted of the etching target material E is measured after the etching process, and the etching quantity adjustment value $\Delta D$ is automatically calculated in correspondence to the difference between the CD value Daft and the target CD value Dtag. More specifically, the adjustment value may be calculated as expressed in (2) below.

$$\Delta D = D_{aft} - D_{tag} \quad (2)$$

The adjustment value $\Delta D$ is initially set to 0 and also is reset to 0 following maintenance work, e.g., after the inside of the processing chamber is cleaned or a component is replaced, since the conditions inside the processing chamber improve through the maintenance work and thus, the processing parameter value does not need to be adjusted immediately after the maintenance work. Through these measures, the adjustment value is optimized by taking into consideration the shift in the etching quantity occurring after the maintenance work so as to ensure that the target CD value is achieved at all times either before or after maintenance work. It is to be noted that while the adjustment value calculated in the feedback calculation is the etching quantity adjustment value $\Delta D$ in the explanation provided above, the present invention is not limited to this example and a processing parameter (e.g., etching time length) adjustment value may be calculated in the feedback calculation.

The etching quantity computation expression (e.g., expression (1)) based upon which the etching quantity is calculated to be used in the feedforward calculation, the adjustment value computation expression (e.g., expression (2)) used in the feedback calculation and the like may be stored in advance in the calculation data table 486 shown in FIG. 5. These computation expressions may be set, edited and the like in response to operations performed by the operator at the input/output means 440. In addition, computation expressions other than these may be used.

When continuously transferring and processing wafers, it is desirable to assure a high throughput by minimizing the time lag between the end of wafer processing in a processing chamber and the start of the processing on the next wafer in the processing chamber. However, the results obtained by executing the feedback calculation are reflected in the feedforward calculation described above. This means that if the next wafer is transferred toward the processing chamber where the current wafer processing is still underway, feedforward calculation may be executed without reflecting the results of the most recent feedback calculation depending upon the timing with which the wafer is transferred and timing with which the feedforward calculation is executed.

For instance, if the feedforward calculation is executed with the timing with which the CD value of a second wafer having been carried into the measurement chamber is measured while the processing on a first wafer is underway in the processing chamber, the feedforward calculation will be executed without reflecting the results of the feedback calculation executed for the most recently processed wafer, i.e., the first wafer.

While it may appear that the feedforward calculation should be executed by transferring the subsequent wafer, i.e., the second wafer after completing the feedback calculation executed based upon the processing results for the first wafer most recently processed in the processing chamber, this is bound to result in a greatly reduced throughput since the next wafer is carried into the measurement chamber for the preprocessing measurement only after the post-processing measurement for the preceding wafer is completed.

As an alternative, the timing with which the feedforward calculation is executed may be retarded as much is possible by, for instance, executing the feedforward calculation with the timing with which a wafer is transferred to a stage immediately preceding the processing chamber (e.g., to a loadlock chamber). However, this alternative is problematic in that if the value of the processing parameter (e.g., the etching time) is determined to be beyond the allowable range at the time of the feedforward calculation, the etching process cannot be executed in the processing chamber and thus, the wafer transfer processing will have been executed in vain.

In addition, there is an issue to be addressed in a substrate processing apparatus equipped with a plurality of processing chambers where etching processes identical to one another are executed in that since a next wafer is transferred to the processing chamber where the processing has ended ahead of the other processing chambers, to undergo the etching process so as to assure a high throughput, a superfluous wafer transfer processing may be executed much in the same way as that explained earlier. For instance, if feedforward calculation is executed and the processing parameter value (e.g., the etching time length) is judged to be outside the allowable range just as the wafer has been transferred to an entry point to the processing chamber where the processing has been completed first, the wafer will be transferred to an entry point to another processing chamber and feedforward calculation will be executed in correspondence to the other processing chamber since the etching process cannot be executed in the first processing chamber. If the processing parameter value (e.g., the etching time length) is judged to be outside the allowable range through the feedforward calculation executed at this point as well, the etching process cannot be executed in the other processing chamber either. If the wafer cannot be processed at all, as in this scenario, the wafer transfer processing will have been executed completely in vain.

Accordingly, a first feedforward calculation is executed when a preprocessing surface profile is measured and then a decision is made as to whether or not there are processing chambers with resulting processing parameter values judged to be within the corresponding allowable ranges in the embodiment. Subsequently, the wafer is transferred toward a processing chamber with a processing parameter value judged to be within the corresponding allowable range only, and with the wafer delivered to the entry point to the processing chamber, a second feedforward calculation is executed after completing the feedback calculation based upon the most recent processing executed in the particular processing chamber.

As described above, a decision is made as to whether or not the processing parameter values calculated in the first feedforward calculation (first calculation) are within the corresponding allowable ranges, the wafer is transferred to a specific processing chamber only if it is decided that the wafer should be transferred to the particular processing chamber. As a result, the problematic situation which tends to occur in the related art, whereby a wafer having been already transferred to the processing chamber cannot be processed with the processing parameter value judged to be beyond the allowable range, can be prevented. In other words, a superfluous execution of wafer transfer processing is prevented.

In addition, in the second feedforward calculation can be executed by incorporating the results of the feedback calculation executed based upon the most recent processing in the processing chamber, achieving an improvement in the adjustment accuracy for the processing parameter calculated in the feedforward calculation. Furthermore, the processing parameter value calculated in the first feedforward calculation is not intended to be used in the actual execution of wafer processing and thus, the preprocessing CD value Dbef measurement can be executed while the immediately preceding wafer is being processed, allowing the wafer processing to be executed without lowering the throughput.

(Specific Example of Wafer Processing)

Figure 9A:
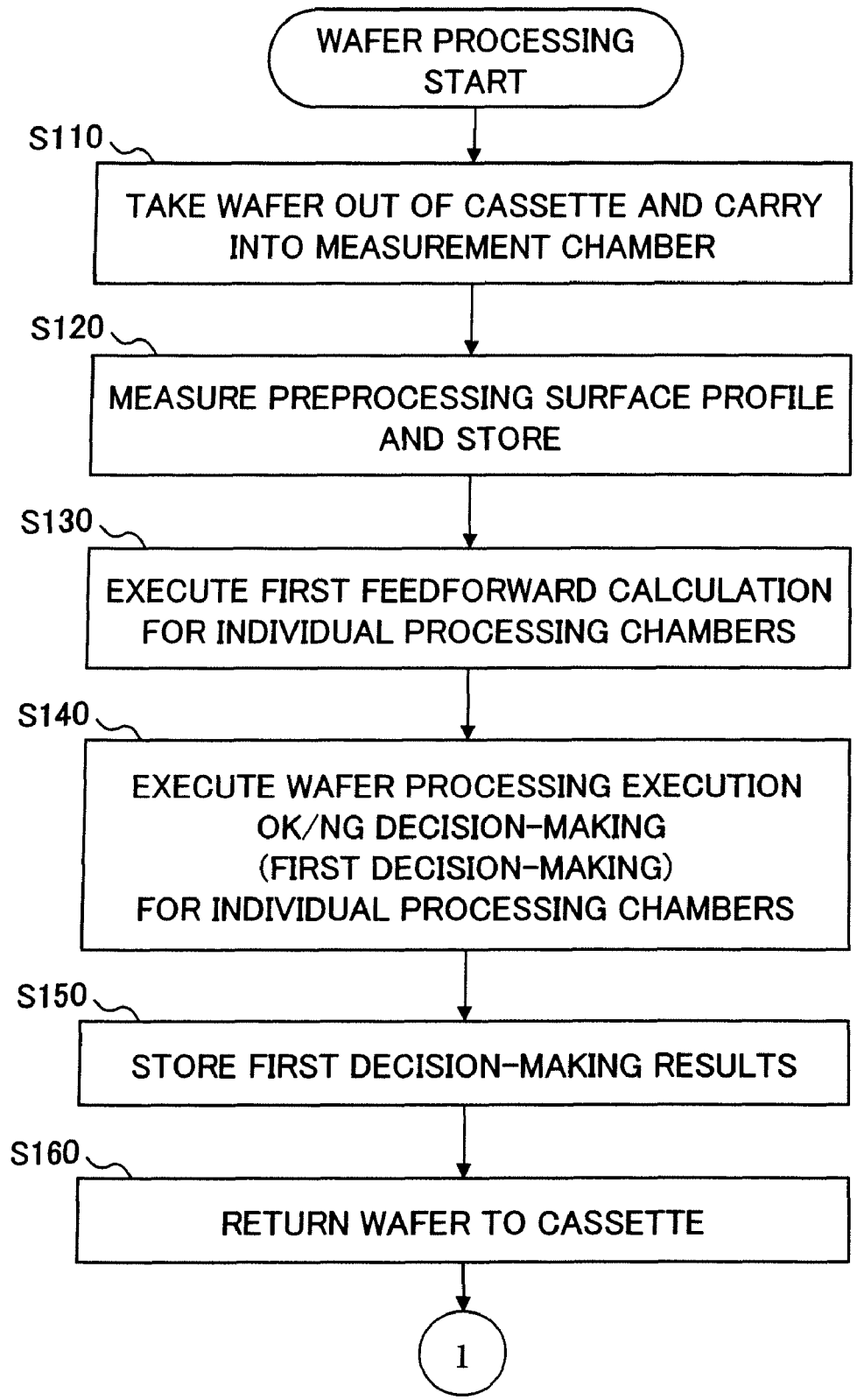
FIG. 9A presents a flowchart of a specific example of wafer processing that may be executed in the embodiment.
Figure 9B:
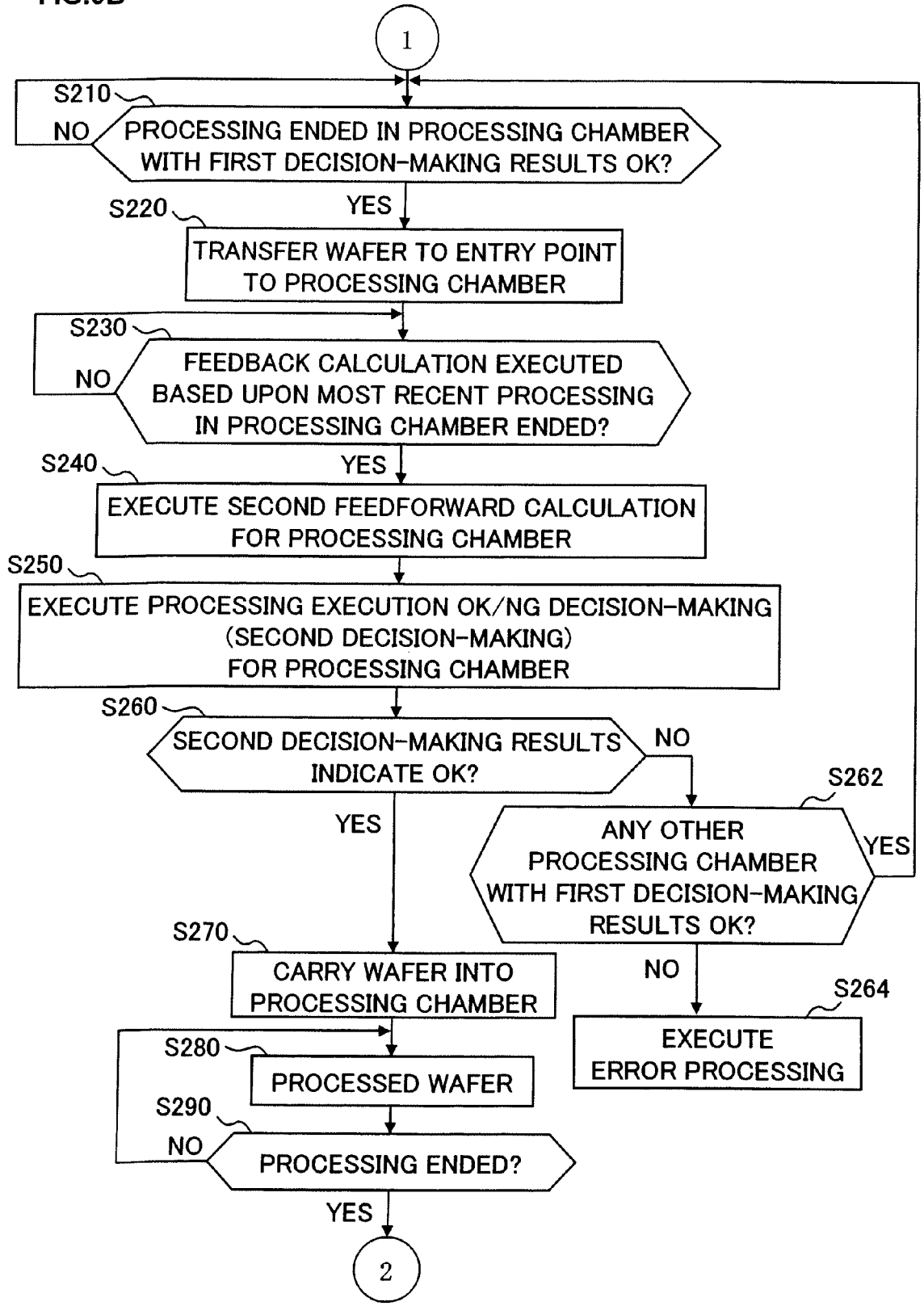
FIG. 9B presents a flowchart, of the specific example of wafer processing in continuation from FIG. 9A.
Figure 9C:
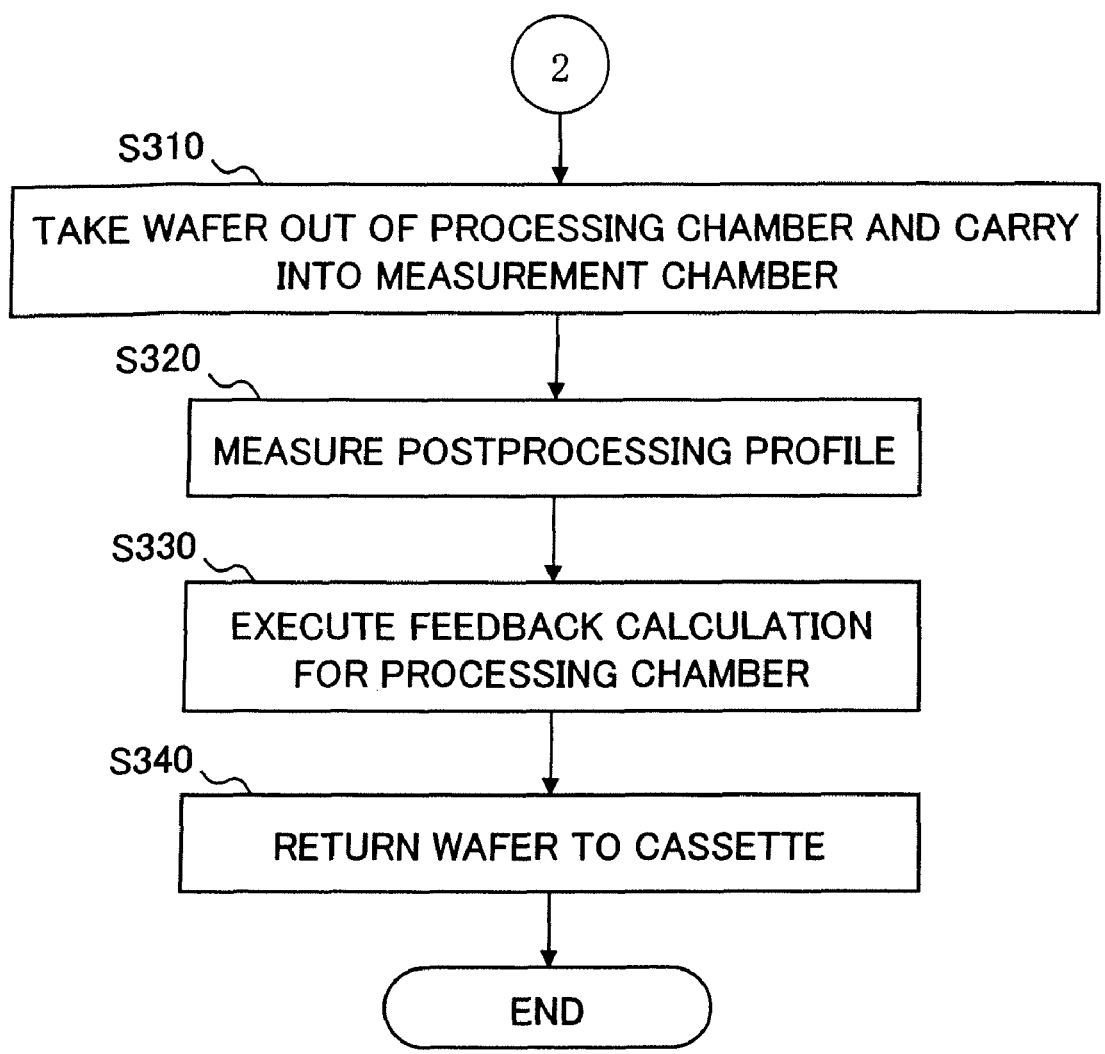
FIG. 9C presents a flowchart, of the specific example of wafer processing in continuation from FIG. 9B.

Next, a specific example of wafer processing during which the feedforward calculation described above is executed for optimal wafer transfer is explained in reference to drawings. FIGS. 9A through 9C present a flowchart of the specific example of the wafer processing executed in the embodiment.

In the flowchart presented in FIG. 9A, the first feedforward calculation is executed to make a decision as to whether or not the wafer processing can be executed and in the flowchart presented in FIG. 9B, the second feedforward calculation is executed in conjunction with subsequent wafer processing. In addition, in the flowchart presented in FIG. 9C, feedback calculation is executed upon completing the wafer processing.

First, execution OK/NG decision-making is executed to judge whether or not wafer processing can be executed in the individual processing chambers 140A and 140B. For instance, as shown in FIG. 9A, a wafer is taken out of a cassette container and carried into the measurement chamber 300 in step S110. More specifically, a wafer W taken out of, for instance, the cassette container 134A is carried into the orienter 134 via the common transfer mechanism 160 for positioning. Once the wafer W is positioned, the wafer W is carried out of the orienter 137 and carried into the measurement chamber 300 via the common transfer mechanism 160.

Next, the preprocessing surface profile (e.g., the CD value of the target element) of the wafer is measured in the measurement chamber 300 and the measured surface profile is stored into the surface profile data table 482 in step S120 (preprocessing measurement phase).

Next, in step S130, the first feedforward calculation is executed for the processing chambers 140A and 140B (first calculation phase) and, based upon the results of the first feedforward calculation, a decision is made in step S140 as to whether or not the wafer processing can be executed in the processing chambers 140A and 140B (first decision-making phase). In the first decision-making phase, the values of the processing parameter having been calculated in the first feedforward calculation, for instance, are checked to determine whether or not they are within the corresponding allowable adjustment ranges. Then, first decision-making results OK are indicated for a processing chamber with the processing parameter value thereof judged to be within the allowable adjustment range, first decision-making results NG are indicated for a processing chamber with the processing parameter value thereof judged to be outside the allowable adjustment range, and these decision-making results are stored into the decision-making data table 488 in correspondence to the individual processing chambers 140A and 140B in step S150.

The sequence of processing executed in steps S130 through S1150 is now explained in further detail. In the first feedforward calculation executed in step S130, a measurement value obtained by actually measuring the preprocessing surface profile is read out from the surface profile data table 482 and the processing parameter values for achieving the target value are automatically calculated based upon the measurement value. For instance, if the CD value is measured as the surface profile and the etching time length is calculated as the processing parameter, the etching quantity D is first determined based upon the CD value Dbef obtained through preprocessing measurement and the target CD value Dtag and the etching time length for achieving this etching quantity D is then calculated.

It is to be noted that the first feedforward calculation and the first decision-making processing are executed individually for the processing chamber 140A and 140B for the following reason. When determining the etching quantity D through the feedforward calculation, the feedback calculation results are reflected as expressed in, for instance, computation expression (1) by adding the adjustment value ΔD calculated in the feedback calculation. This adjustment value ΔD is affected by the characteristics of the individual processing chambers 140A and 140B and the timing with which the processing is executed in the individual processing chambers 140A and 140B. Accordingly, adjustment values calculated in correspondence to the individual processing chambers 140A and 140B are stored in the calculation data table 486. For this reason, if the adjustment values ΔD for the processing chambers 140A and 140B do not match, the etching quantities D calculated by incorporating the adjustment values ΔD, too, will assume values different from each other. Thus, processing parameter values are calculated each in correspondence to one of the processing chambers 140A and 140B through the first feedforward calculation executed in step S130 and a decision is made through the first decision-making step S140 as to whether or not the processing parameter values having been calculated for the individual processing chambers 140A and 140B are each within the corresponding allowable adjustment range.

As explained above, the decision-making results are obtained through the first decision-making separately for the processing chamber 140A and the processing chamber 140B. Depending upon, for instance, the timing with which the first decision-making is executed, decisions will be made in correspondence to the processing chambers 140A and 140B in any of the following three combinations; first decision-making results OK for one of the processing chambers 140A and 140B and first decision-making results NG for the other processing chamber; first decision-making results OK for both processing chambers 140A and 140B and first decision-making results NG for both processing chambers 140A and 140B.

Figure 10:
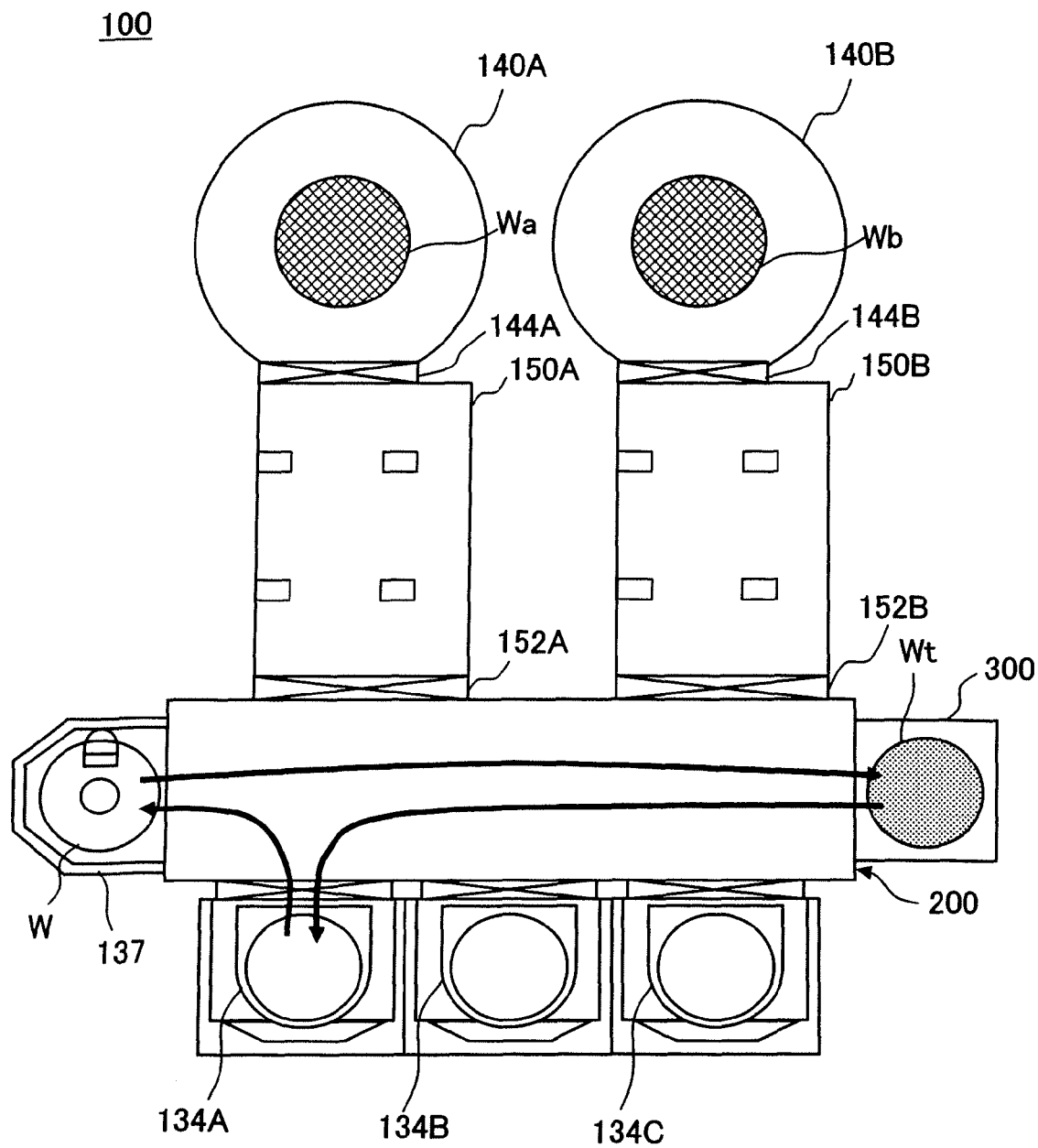
FIG. 10 illustrations the flow of wafers during the wafer processing executed in the embodiment and the timing with which the first feedforward calculation is executed.

During the wafer processing executed as described above in the embodiment, the first feedforward calculation is executed immediately after the measurement of the preprocessing surface profile of, for instance, the wafer Wt in FIG. 10, is completed in the measurement chamber 300. Since this allows the decision as to whether or not the wafer Wt can be processed in the processing chambers 140A and 140B to be made before transferring the wafer Wt to the processing chamber 140A or 140B, superfluous transfer of the wafer Wt can be prevented.

As described above, the first feedforward calculation is executed at a relatively early stage prior to transferring the wafer Wt to the processing chamber 140A or 140B. This means that the first feedforward calculation may be executed while wafers Wa and Wb having already been transferred to the processing chambers 140A and 140B are undergoing the processing in the processing chambers 140A and 140B, as shown in FIG. 10. The adjustment values ΔD used in the first feedforward calculation executed under such circumstances, do not reflect the results of feedback calculation executed based upon the most recent wafer processing (i.e., the adjustment values ΔD will not have been updated).

Accordingly, the parameter value (e.g., the etching time length) based upon which the actual wafer processing is to be executed is recalculated in the second feedforward calculation executed after the wafer recipient processing chamber is determined and before the wafer is actually carried into the processing chamber, as described in detail later. This procedure allows the second feedforward calculation to be executed after completing execution og the feedback calculation based upon the most recent processing having been executed in the particular processing chamber and thus makes it possible to calculate the etching time length reflecting the results of the most recent feedback calculation.

Upon completing the first decision-making, the wafer is returned to the cassette container in step S160. More specifically, the wafer Wt is taken out of the measurement chamber 300 and is returned to the initial cassette container 134A via the common transfer mechanism 160, as shown in FIG. 10.

In this state, the operation waits in standby, suspending the transfer of the wafer Wt until it is decided in step S210 in FIG. 9B that the processing having been underway in the processing chamber with the first decision-making results OK has ended. Namely, the operation waits in standby until the processing in either the processing chamber 140A or the processing chamber 140B ends and as the processing in either processing chamber ends, a decision is made as to whether or not first decision-making results OK have been stored in correspondence to the particular processing chamber by checking the decision-making results in the decision-making data table 488. If first decision-making results NG are returned in correspondence to the processing chamber, the operation continuously waits in standby without transferring the wafer toward the processing chamber.

If, on the other hand, first decision-making results OK are returned for the processing chamber, the wafer is transferred to the entry point to the processing chamber in step S220. Through this procedure, it is ensured that the wafer is transferred to the processing chamber only if the first decision-making results OK have been returned in correspondence to the processing chamber and that the wafer is not transferred to the processing chamber with the first decision-making results NG even if the processing therein is completed first. As a result, the undesirable situation in which decision-making results NG are indicate after the wafer is transferred is prevented, and superfluous wafer transfer is prevented.

Figure 11:
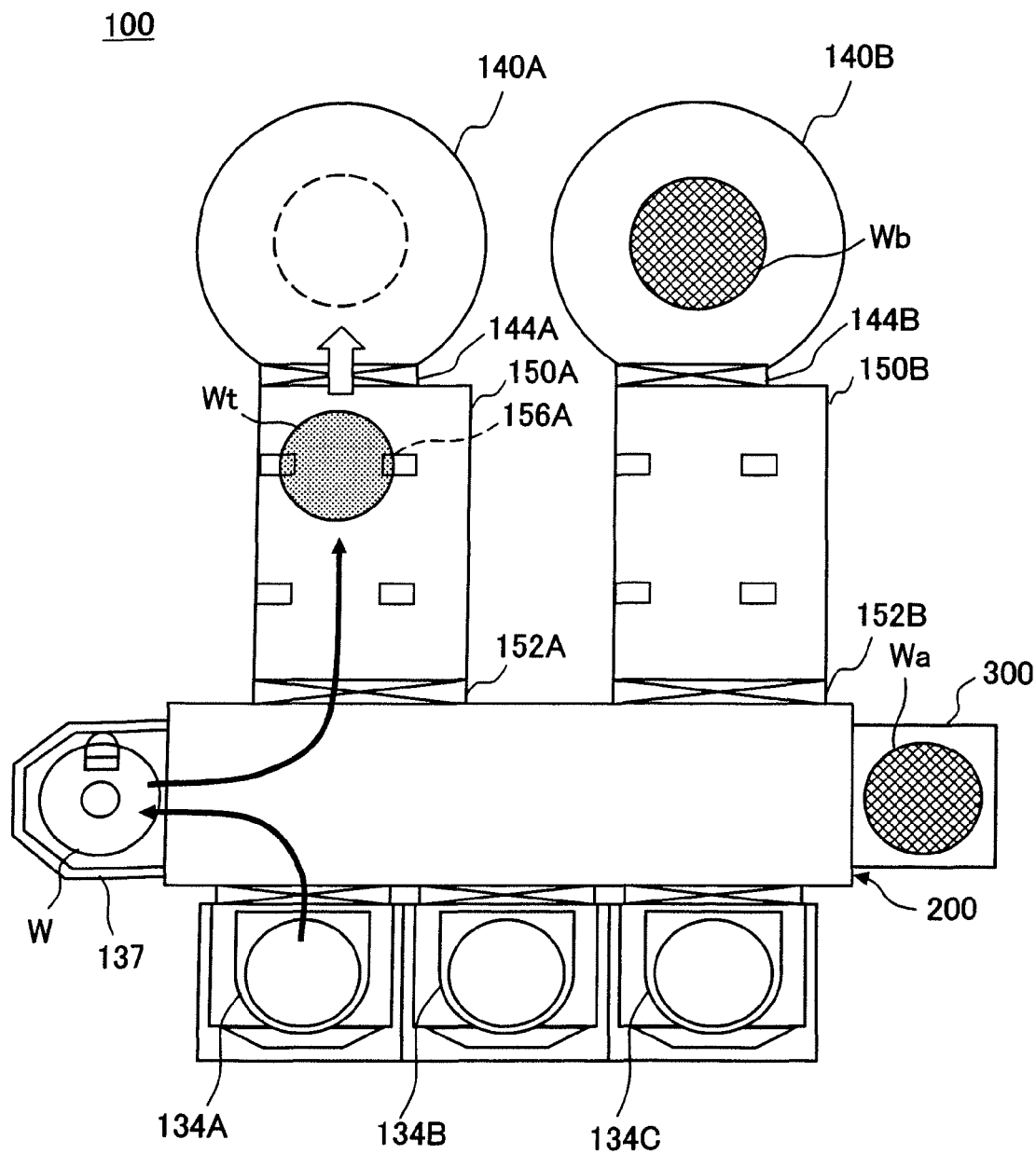
FIG. 11 illustrates the flow of wafers during the wafer processing executed in the embodiment and the timing with which the second feedforward calculation is executed.

The operation executed to transfer the wafer Wt from the cassette container 134A to the entry point to, for instance, the processing chamber 140A is now explained in more specific terms. As shown in FIG. 11, the wafer Wt is taken out from the cassette container 134A again and is carried into the orienter 137 for positioning via the common transfer mechanism 160. The wafer Wt having been positioned in the orienter 137 is carried out of the orienter 137 via the common transfer mechanism 160. As the gate valve 152A opens, the common transfer mechanism 160 is able to place the wafer Wt on the buffer stage 154A in the loadlock chamber 150A. The wafer Wt on the buffer stage 154A in the loadlock chamber 150A is then transferred onto the buffer stage 156A located closer to the processing chamber 140A via the individual transfer mechanism 170A. Once the wafer Wt is carried into the loadlock chamber 150A, the gate valve 152A is closed.

It is to be noted that if the wafer Wt is being carried into the processing chamber 140A as a replacement for the processed wafer Wa resulting from the most recent processing executed in the processing chamber 140A, the wafer Wt is carried out of the orienter 137 on one of the end effectors of the common transfer mechanism 160 and the wafer Wt having been carried out of the orienter is first transferred to a point just outside the loadlock chamber 150A in the vacuum processing unit 110A.

At this point, the processed wafer Wa is carried out of the processing chamber 140A and is transferred to the buffer stage 154A via the individual transfer mechanism 170A, and as the internal pressure in the loadlock chamber 150A is adjusted and the gate valve 152A is opened, the processed wafer Wa is carried out on the other end effector of the common transfer mechanism 160 with the wafer Wt held on the first end effector carried into the loadlock chamber 150A and placed on to the buffer stage 154A. Once the wafer Wt is carried into the loadlock chamber 150A, the gate valve 152A is closed.

The wafer Wa is carried into the measurement chamber 300 via the common transfer mechanism 160. In the measurement chamber 300, the postprocessing surface profile (e.g., the target element CD value) of the wafer Wa is measured and the feedback calculation is executed. Through the feedback calculation, the etching quantity adjustment value $\Delta D$ is calculated based upon the postprocessing CD value of the wafer Wa and the adjustment value $\Delta D$ thus calculated is written over the previous adjustment value as an update. The feedback calculation executed based upon the results of the processing most recently executed in the processing chamber 140A, i.e., the processing having been executed on the wafer Wa, thus ends.

The operation waits for the feedback calculation executed based upon the results of the most recent processing executed in the processing chamber to end in step S230. Once the feedback calculation ends, the second feed forward calculation for the processing chamber is executed in step S240 to determine the processing parameter value based upon which the wafer processing is to be actually executed in the processing chamber (second calculation phase). Then, in step S250, a decision is made based upon the results of the second feed forward calculation as to whether or not the wafer processing can be executed in the processing chamber (second decision-making phase). In the second decision-making phase, a decision as to whether or not the processing parameter value calculated in the second feed forward calculation is within the allowable adjustment range, for instance, may be made. Second decision-making results OK are indicated if the processing parameter value having been calculated for the processing chamber is within the allowable adjustment range but second decision-making results NG are indicated if the processing parameter value is outside the allowable adjustment range.

In the second feed forward calculation, the pre-processing surface profile measurement value obtained through the pre-processing measurement is read out from the surface profile data table 482 and the processing parameter value for achieving the target value is automatically calculated based upon the measurement value thus read out. For instance, if the CD value is measured as the surface profile and the etching time length is calculated as the processing parameter as explained earlier, the etching quantity D is first determined based upon the CD value Dbef obtained through the preprocessing measurement and the target CD value Dtag and then the etching time length for achieving this etching quantity D is calculated.

The adjustment value $\Delta D$ having been obtained through the feedback calculation executed as expressed in (1) in correspondence to the specific processing chamber (the processing chamber where the processing is to be executed) is used in the second feed forward calculation to determine the processing parameter value based upon which the wafer processing is to be actually executed. It is to be noted that the adjustment value $\Delta D$ used in the second feed forward calculation is the most up-to-date adjustment value resulting from the update made based upon the results of the feedback calculation for the wafer most recently processed in the processing chamber.

If the second decision-making results NG are indicated in step S260, a decision is made in step S262 as to whether or not there is any other processing chamber with the first processing results OK by checking the decision-making data table 488. If it is decided in step S262 that there is another processing chamber with the first decision-making results OK, the operation returns to execute the processing in step S210 and subsequent steps for the other processing chamber. Thus, even the second decision-making results NG are indicated for the processing chamber 140A, the wafer can be transferred to the processing chamber 140B to undergo the processing therein provided that the first decision-making results OK have been returned for the processing chamber 140B.

If it is decided in step S262 that there is no other processing chamber with the first decision-making results OK, error processing is executed in step S264. In the error processing, an error message with respect to the particular wafer may be brought up on display at the display means 430 or a warning may be issued via the alerting means 450.

If, on the other hand, the second decision-making results OK are indicated in step S260, the wafer is carried into the processing chamber in step S270 and the wafer is processed in step S280 (processing phase). More specifically, as the gate valve 144A is opened to allow entry to the processing chamber 140A in the ready state, the wafer Wt in the loadlock chamber 150A is carried into the processing chamber 140A via the individual transfer mechanism 170A, as shown in FIG. 11. After the wafer Wt is carried into the processing chamber 140A, the gate valve 144A is closed. Then, the wafer Wt undergoes the etching process in the processing chamber 140A based upon the processing parameter having been calculated in the second feed forward calculation.

Figure 12:
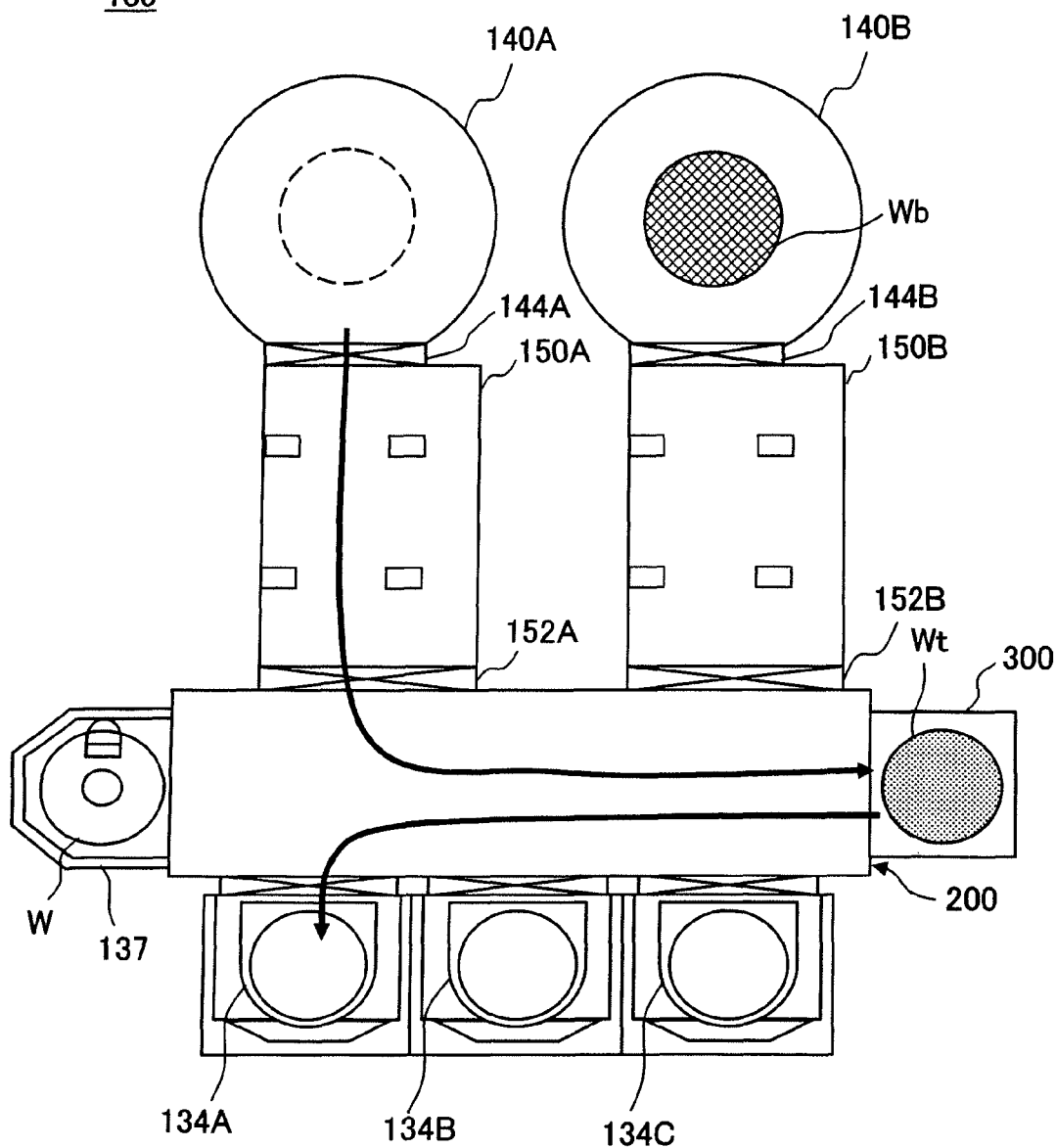
FIG. 12 illustrates the flow of wafers during the wafer processing executed in the embodiment and the timing with which the feedback calculation is executed.

Subsequently, a decision is made in step S290 as to whether or not the wafer processing has been completed, and if it is decided that the wafer processing has been completed, a feedback calculation is executed in step S310 and subsequent steps in FIG. 9C. Namely, in step S310, the wafer is taken out of the processing chamber, delivered to the measurement chamber 300 and carried into the measurement chamber 300. More specifically, as the processing on the wafer Wt ends in the processing chamber 140A and the gate valve 144A is opened, the wafer Wt is carried out into the loadlock chamber 150A via the individual transfer mechanism 170A, as shown in FIG. 12.

Then, after the gate valve 144A is closed, the wafer Wt is carried out into the transfer chamber 200. Namely, the pressure inside the loadlock chamber 150A is reset to atmospheric pressure in order to eliminate the difference between the pressure in the transfer chamber 200 at atmospheric pressure and the pressure inside the loadlock chamber 150A in the vacuum state. As the gate valve 152A is opened, the wafer Wt is carried out of the loadlock chamber 150A into the transfer chamber 200 on the common transfer mechanism 160 and then the gate valve 152A is closed. Subsequently, the wafer Wt, carried on the common transfer mechanism 160 to the measurement chamber 300, is placed onto the stage within the measurement chamber 300.

Next, the postprocessing surface profile (e.g., the CD value of a target element) of the wafer is measured in the measurement chamber 300 and the post processing surface profile measurement value is stored into the surface profile data table 482 in step S320.

Next, in step S330, the feedback calculation is executed for the particular processing chamber. For instance, the postprocessing surface profile measurement value is read out from the surface profile data table 482 and the adjustment value is calculated based upon the difference between the measurement value and the target value. If the CD value is measured as the surface profile as explained earlier, the etching quantity adjustment value ΔD is first determined based upon the difference between the CD value Daft obtained through the postprocessing measurement and the target CD value Dtag and the adjustment value ΔD is then used to update the calculation data table 486 by overwriting the previous adjustment value for the processing chamber.

Once the postprocessing surface profile measurement ends, the wafer is returned to the cassette container in step S340. More specifically, the common transfer mechanism 160 takes the wafer Wt out of the measurement chamber 300 and carries it back to the cassette container 134A The sequence of the wafer processing thus ends.

In the wafer processing executed in the embodiment as described above, processing parameter values are calculated for the individual processing chambers 140A and 140B through the first feed forward calculation (first calculation) executed before carrying a wafer to either the processing chamber 140A or the processing chamber 140B and a decision is made for each of the processing chambers 140A and 140B as to whether or not the processing parameter value having been calculated is within the corresponding allowable range. In other words, before actually transferring a wafer to the processing chamber 140A or 140 B, a decision is made as to whether or not the transfer processing should be executed. The wafer is then transferred only to a processing chamber with a processing parameter value judged to be within the allowable range to prevent superfluous transfer of wafers.

It is to be noted that while an explanation is given above in reference to the embodiment on an example in which the present invention is adopted in the substrate processing apparatus 100 equipped with two processing chambers 140A and 140B, the present invention is not limited to this example and it may be adopted in a substrate processing apparatus equipped with a single processing chamber or a substrate processing apparatus 100 equipped with three or more processing chambers. Basically, superfluous wafer transfer is prevented with greater effect when there are a greater number of processing chambers.

In addition, the present invention having been described in detail in reference to the embodiment may be adopted in a system constituted with a plurality of devices or in an apparatus constituted with a single device. Furthermore, it is obvious that the present invention may be achieved by providing a system or an apparatus with a medium such as a storage medium having stored therein a software program enabling the functions of the embodiment and by reading out and executing the program stored in the medium at the computer (or a CPU or MPU) in the system or the apparatus.

In such a case, the program itself read out from the medium such as a storage medium embodies the functions of the embodiment described above and the medium such as a storage medium having the program stored therein embodies the present invention. The medium such as a storage medium through which the program is provided may be, for instance, a floppy (registered trademark) disk, a hard disk, an optical disk, a magneto-optical disk, a CD-ROM, a CD-R, a CD-RW, a DVD-ROM, a DVD-RAM, a DVD-RW, a DVD+RW, magnetic tape, a nonvolatile memory card, or a ROM. Alternatively, such a program may be obtained through a download of the program into a medium via a network.

It is to be noted that the scope of the present invention includes an application in which an OS or the like operating on the computer executes the actual processing in part or in whole in response to the instructions in the program read out by the computer and the functions of the embodiment are achieved through the processing thus executed, as well as an application in which the functions of the embodiment are achieved as the computer executes the program it has read out.

The scope of the present invention further includes an application in which the program read out from the medium such as a storage medium is first written into a memory in a function expansion board loaded in the computer or a function expansion unit connected to the computer, a CPU or the like in the function expansion board or the function expansion unit executes the actual processing in part or in whole in response to the instructions in the program and the functions of the embodiment described above are achieved through the processing.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the embodiment on an example in which the present invention is adopted in a tandem-type substrate processing apparatus, with a plurality of processing units, each constituted by connecting a loadlock chamber to a processing chamber, connected in parallel to the transfer unit, the present invention is not limited to this example and it may be adopted in a cluster tool-type substrate processing apparatus with a plurality of processing chambers in a processing unit connected around a common transfer chamber. In the latter case, too, a measurement chamber should be connected to the transfer unit as in the embodiment explained earlier. In short, the present invention may be adopted in various types of substrate processing apparatuses, as long as they include a measurement chamber and a processing chamber.

What is claimed is:

1. A substrate processing method to be adopted in a substrate processing apparatus that includes a processing chamber where processing is executed on a processing target substrate based upon a specific processing parameter and a measurement chamber where a preprocessing surface profile and a postprocessing surface profile of the processing target substrate are measured, comprising:
    a preprocessing measurement phase in which the preprocessing surface profile of the processing target substrate is measured in said measurement chamber;
    a first calculation phase executed before starting to transfer the processing target substrate toward said processing chamber, in which a processing parameter value for achieving a target surface profile is calculated by using a preprocessing surface profile measurement value obtained by measuring said preprocessing surface profile;
    a decision-making phase in which a decision is made as to whether or not said processing parameter value having been calculated is within a preset allowable range;
    a second calculation phase executed during the time elapsing after starting to transfer the processing target substrate toward said processing chamber and ending before the processing target substrate is actually carried into said processing chamber when said processing parameter value is judged to be within the allowable range in said decision-making phase in which said processing parameter value for achieving said target surface profile is recalculated by using an adjustment value obtained based upon a postprocessing surface profile measurement value resulting from measurement of the postprocessing surface profile of a processing target substrate having been most recently processed in said processing chamber and said preprocessing surface profile measurement value; and
    a processing phase in which the processing target substrate is carried into said processing chamber and is processed based upon said processing parameter value calculated in said second calculation phase.

2. A substrate processing method according to claim 1, further comprising:
    a postprocessing measurement phase in which the processing target substrate having been processed is carried into said measurement chamber and the postprocessing surface profile is measured; and
    an adjustment value calculation phase in which said adjustment value to be used to adjust said processing parameter value is calculated based upon the postprocessing surface profile measurement value.

3. A substrate processing method according to claim 1, wherein:
    the surface profile is represented by a measurement of a target element formed on the processing target substrate.

4. A substrate processing method according to claim 1, wherein:
    said processing parameter is the processing time length over which the processing target substrate is processed.

5. A substrate processing method to be adopted in a substrate processing apparatus that includes a plurality of processing chambers where processing target substrates are processed based upon a specific processing parameter and a measurement chamber where a preprocessing surface profile and a postprocessing surface profile of a processing target substrate are measured, comprising:
    a preprocessing measurement phase in which said preprocessing surface profile of the substrate target substrate is measured in the measurement chamber;
    a first calculation phase executed before starting to transfer the processing target substrate toward one of said processing chambers, in which values of said processing parameter for achieving a target surface profile are calculated each in correspondence to one of said processing chambers by using a preprocessing surface profile measurement value obtained by measuring said preprocessing surface profile;
    a decision-making phase in which a decision is made as to whether or not the processing parameter values having been calculated in correspondence to said processing chambers are each within a predetermined allowable range;
    a second calculation phase executed during the time elapsing after starting transfer of the processing target substrate toward one of processing chambers with processing parameter values thereof each having been judged in said decision-making phase to be within the allowable range, and ending before the processing target substrate is actually carried into the processing chamber, in which a processing parameter value for achieving said target surface profile is recalculated by using an adjustment value determined by using a postprocessing surface profile measurement value obtained by measuring the postprocessing surface profile of a processing target substrate having been most recently processed in said processing chamber and the preprocessing surface profile measurement value; and
    a processing phase in which the processing target substrate is carried into said processing chamber is processed based upon said processing parameter value calculated in said second calculation phase.

6. A substrate processing method to be adopted in a substrate processing apparatus that includes a plurality of processing chambers where processing target substrates are processed based upon a specific processing parameter and a measurement chamber where a preprocessing surface profile and a postprocessing surface profile of a processing target substrate are measured, comprising:
    a preprocessing measurement phase in which said preprocessing surface profile of the substrate target substrate is measured in the measurement chamber;

a first calculation phase executed before starting to transfer the processing target substrate toward one of said processing chambers, in which values of said processing parameter for achieving a target surface profile are calculated in correspondence to the individual processing chambers by using a preprocessing surface profile measurement value obtained by measuring the preprocessing surface profile;

a first decision-making phase in which a decision is made as to whether or not said processing parameter values having been calculated in correspondence to the individual processing chambers are within a predetermined allowable range;

a second calculation phase executed during the time elapsing after starting transfer of the processing target substrate toward one of said processing chambers with processing parameter values thereof having been judged in said first decision-making phase to be within the allowable range and ending before the processing target substrate is actually carried into said processing chamber, in which a processing parameter value for achieving said target surface profile is recalculated by using an adjustment value determined by using a postprocessing surface profile measurement value obtained by measuring the postprocessing surface profile of a processing target substrate having been most recently processed in said processing chamber and the preprocessing surface profile measurement value;

a second decision-making phase in which a decision is made as to whether or not said processing parameter value calculated in said second calculation phase is within a predetermined allowable range; and a processing phase in which the processing target substrate is carried into said processing chamber and is processed based upon said processing parameter value calculated in said second calculation phase if said processing parameter value is judged in said second decision-making phase to be within the allowable range, but the processing target substrate is transferred toward another processing chamber with a processing parameter value having been judged in said first decision-making phase to be within the allowable range, a processing parameter value is recalculated by executing said second calculation phase and the processing target substrate is processed accordingly if said processing parameter value is judged in said second decision-making phase to be outside the allowable range.

7. A substrate processing method to be adopted in a substrate processing apparatus that includes a plurality of processing chambers where processing target substrates are processed based upon a specific processing parameter and a measurement chamber where a preprocessing target element dimension and a postprocessing target element dimension of a target element on a processing target substrate are measured, comprising:

a preprocessing measurement phase in which said preprocessing target element dimension at the processing target substrate is measured in said measurement chamber;

a first calculation phase executed before starting to transfer the processing target substrate toward one of said processing chambers, in which etching time lengths for achieving a target dimension are calculated each in correspondence to one of said processing chambers based upon a preprocessing target element dimension measurement value obtained by measuring the preprocessing target element dimension;

a decision-making phase in which a decision is made as to whether or not the etching time lengths having been calculated in correspondence to said processing chambers are each within a predetermined allowable range;

a second calculation phase executed during the time elapsing after starting transfer of the processing target substrate toward one of processing chambers with etching time lengths thereof each having been judged in said decision-making phase to be within the allowable range, and ending before the processing target substrate is actually carried into said processing chamber, in which an etching time length for achieving said target surface profile is recalculated by using an adjustment value determined by using a postprocessing surface profile measurement value obtained by measuring the postprocessing surface profile of a processing target substrate having been most recently processed in said processing chamber and the preprocessing surface profile measurement value; and a processing phase in which the processing target substrate is carried into said processing chamber and is etched over the etching time length having been calculated in said second calculation phase.

8. A computer-readable storage medium having stored therein a program to be used when executing substrate processing in a substrate processing apparatus that includes a processing chamber where processing is executed on a processing target substrate based upon a specific processing parameter and a measurement chamber where a preprocessing surface profile and a postprocessing surface profile of the processing target substrates are measured, wherein:

said program enables a computer to execute:

a preprocessing measurement step in which the preprocessing surface profile of the processing target substrate is measured in said measurement chamber;

a first calculation step executed before starting to transfer the processing target substrate toward said processing chamber, in which a processing parameter value for achieving a target surface profile is calculated by using a preprocessing surface profile measurement value obtained by measuring said preprocessing surface profile;

a decision-making step in which a decision is made as to whether or not said processing parameter value having been calculated is within a preset allowable range;

a second calculation step executed during the time elapsing after starting to transfer the processing target substrate toward said processing chamber and ending before the processing target substrate is actually carried into said processing chamber when said processing parameter value is judged to be within the allowable range in said decision-making step in which said processing parameter value for achieving said target surface profile is recalculated by using an adjustment value obtained based upon a postprocessing surface profile measurement value resulting from measurement of the postprocessing surface profile of a processing target substrate having been most recently processed in said processing chamber and said preprocessing surface profile measurement value; and a processing step in which the processing target substrate is carried into said processing chamber and is processed based upon said processing parameter value calculated in said second calculation step.

9. A computer-readable storage medium having stored therein a program to be used when executing substrate processing in a substrate processing apparatus that includes a plurality of processing chambers where processing target substrates are processed based upon a specific processing parameter and a measurement chamber where a preprocessing surface profile and a postprocessing surface profile of a processing target substrate are measured, wherein:

said program enables a computer to execute:

a preprocessing measurement step in which said preprocessing surface profile of the substrate target substrate is measured in the measurement chamber;

a first calculation step executed before starting to transfer the processing target substrate toward one of said processing chambers, in which values of said processing parameter for achieving a target surface profile are calculated each in correspondence to one of said processing chambers by using a preprocessing surface profile measurement value obtained by measuring said preprocessing surface profile;

a decision-making step in which a decision is made as to whether or not the processing parameter values having been calculated in correspondence to said processing chambers are each within a predetermined allowable range;

a second calculation step executed during the time elapsing after starting transfer of the processing target substrate toward one of processing chambers with processing parameter values thereof each having been judged in said decision-making step to be within the allowable range, and ending before the processing target substrate is actually carried into the processing chamber, in which a processing parameter value for achieving said target surface profile is recalculated by using an adjustment value determined by using a postprocessing surface profile measurement value obtained by measuring the postprocessing surface profile of a processing target substrate having been most recently processed in said processing chamber and the preprocessing surface profile measurement value; and a processing step in which the processing target substrate is carried into said processing chamber is processed based upon said processing parameter value calculated in said second calculation step.

* * * * *